US012730414B2

(12) United States Patent
Ryu et al.

(10) Patent No.: US 12,730,414 B2
(45) Date of Patent: Sep. 8, 2026

(54) ELECTRONIC DEVICE WITH SIDE FRAME SERVING AS AN ANTENNA AND HEAT DISSIPATION MEMBER

(71) Applicant: SAMSUNG ELECTRONICS CO., LTD., Suwon-si (KR)

(72) Inventors: Hunyoung Ryu, Suwon-si (KR); Kijung Kim, Suwon-si (KR); Jonggwang Jang, Suwon-si (KR); Dasol Jun, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 314 days.

(21) Appl. No.: 18/462,807

(22) Filed: Sep. 7, 2023

(65) Prior Publication Data

US 2023/0418240 A1 Dec. 28, 2023

Related U.S. Application Data

(63) Continuation of application No. PCT/KR2022/004036, filed on Mar. 23, 2022.

(30) Foreign Application Priority Data

May 21, 2021 (KR) ........................ 10-2021-0065214

(51) Int. Cl.
*G04G 17/04* (2006.01)
*G04G 17/02* (2006.01)
(Continued)

(52) U.S. Cl.
CPC ............. *G04G 17/04* (2013.01); *G04G 17/02* (2013.01); *G04G 17/08* (2013.01); *G04G 19/00* (2013.01);
(Continued)

(58) Field of Classification Search
CPC ........ G04G 17/04; G04G 17/02; G04G 17/08; G04G 19/00; H01Q 1/273; H01Q 1/44;
(Continued)

(56) References Cited

U.S. PATENT DOCUMENTS 8,377,582 B2 * 2/2013 Eom .................. H01M 10/613 429/71
9,680,206 B2 * 6/2017 Youn .................. H04M 1/0249
(Continued)

FOREIGN PATENT DOCUMENTS

CN 208723096 U 4/2019
EP 3454533 3/2019
(Continued)

OTHER PUBLICATIONS

Korean Office Action issued May 21, 2025 in corresponding Korean Patent Application No. 10-2021-0065214.
(Continued)

*Primary Examiner* — Allen L Parker
*Assistant Examiner* — Martin Antonio Asmat Uceda
(74) *Attorney, Agent, or Firm* — Nixon & Vanderhye P.C.

(57) ABSTRACT

In various embodiments, an electronic device may comprise: a housing including a front plate, a rear plate opposite to the front plate, and a side frame surrounding the space between the front plate and the rear plate; and a printed circuit board disposed in the space and having a front end module (FEM) and a heating element comprising a thermally conductive material mounted thereon, wherein the side frame is segmented into at least a first metal portion and a second metal portion, a segmentation member comprising a non-conductive material is disposed between the first metal portion and the second metal portion, and the first metal portion is electrically connected to the front end module, and the second metal portion is connected to the heating element by
(Continued)

heat transfer members comprising a thermal interface material.

17 Claims, 14 Drawing Sheets

(51) Int. Cl.

*G04G 17/08* (2006.01)
*G04G 19/00* (2006.01)
*H01Q 1/27* (2006.01)
*H01Q 1/44* (2006.01)
*H05K 7/20* (2006.01)

(52) U.S. Cl.

CPC ............... *H01Q 1/273* (2013.01); *H01Q 1/44* (2013.01); *H05K 7/2039* (2013.01)

(58) Field of Classification Search

CPC .. H05K 7/2039; H05K 7/205; H05K 7/20409; G04R 60/02; G04R 60/06; G06F 1/20; H04B 1/0343

See application file for complete search history.

(56) References Cited

U.S. PATENT DOCUMENTS

| | | | | |
|---|---|---|---|---|
| 9,743,553 | B2 * | 8/2017 | Kim | H05K 7/20336 |
| 10,048,722 | B2 * | 8/2018 | Huang | H10N 10/817 |
| 10,133,158 | B2 * | 11/2018 | Yasuda | H04N 23/51 |
| 10,285,303 | B2 * | 5/2019 | Williams | H05K 7/20 |
| 10,484,958 | B2 * | 11/2019 | Sayem | H05K 7/1427 |
| 11,343,941 | B2 * | 5/2022 | Ide | G03B 17/55 |
| 11,764,460 | B2 * | 9/2023 | Zhao | H01Q 1/273 343/702 |
| 11,910,516 | B2 * | 2/2024 | Moon | G06F 1/1698 |
| 12,193,189 | B2 * | 1/2025 | Masuda | H05K 7/20336 |
| 2005/0219955 | A1 * | 10/2005 | Xu | G04R 60/02 368/88 |
| 2011/0279331 | A1 * | 11/2011 | Mattis | H01Q 1/02 343/702 |
| 2014/0078679 | A1 * | 3/2014 | Tsunoda | H05K 7/20445 361/720 |
| 2015/0070219 | A1 * | 3/2015 | Dinh | H01Q 1/085 343/893 |
| 2015/0171916 | A1 * | 6/2015 | Asrani | H04M 1/0202 455/575.7 |
| 2015/0188217 | A1 * | 7/2015 | Tsai | G04G 17/04 343/702 |
| 2016/0006110 | A1 * | 1/2016 | Jain | H01Q 1/36 343/702 |
| 2020/0245393 | A1 | 7/2020 | Teyeb et al. | |
| 2023/0066579 | A1 * | 3/2023 | Tondellier | H05K 7/20845 |

FOREIGN PATENT DOCUMENTS

| | | | |
|---|---|---|---|
| JP | 3278053 | B2 | 4/2002 |
| JP | 3802405 | B2 | 5/2006 |
| JP | 2007318210 | A | 12/2007 |
| JP | 6359909 | B2 | 6/2018 |
| JP | 6528664 | B2 | 5/2019 |
| KR | 100553967 | B1 | 3/2006 |
| KR | 20150064566 | A | 6/2015 |
| KR | 20160120495 | A | 10/2016 |
| KR | 20170053385 | A | 5/2017 |
| KR | 20180042606 | A | 4/2018 |
| KR | 20190052105 | A | 5/2019 |
| KR | 20200024301 | A | 3/2020 |
| KR | 20200100973 | A | 8/2020 |
| KR | 20210051472 | A | 5/2021 |
| WO | 2020/151735 | | 7/2020 |
| WO | 2020/019821 | | 1/2022 |

OTHER PUBLICATIONS

Extended European Search Report dated Oct. 2, 2024 issued in European Patent Application No. 23753149.6.

Ericsson, 3GPP TSG-RAN WG2, “Configuring or resuming MR-DC in RRC Resume”, Meeting Notes, Meeting #105bis, Apr. 8-12, 2019, 4 pages.

Samsung, 3GPP TSG-RAN, “Multi-RAT Multi-Connectivity (MR-MC) for 5G Advanced”, Meeting Notes, Meeting #93-e, Sep. 13-17, 2021, 5 pages.

Extended European Search Report dated Sep. 10, 2024 issued in European Patent Application No. 22804821.1.

International Search Report for PCT/KR2022/004036, mailed Jun. 27, 2022, 2 pages.

Written Opinion of the ISA for PCT/KR2022/004036, mailed Jun. 27, 2022, 3 pages.

* cited by examiner 700
732
731
740
790a
781
782
790b
AP
770
7131
7133
7132a
713
7132
7132b
HPd
z
y
x

| LTE | | B 01 | B 02 | B 03 | B 04 | B 05 | B 07 | B 08 | B 12 | B 13 | B 20 |
|---|---|---|---|---|---|---|---|---|---|---|---|
| | | 1920-2110 | 1850-1930 | 1710-1805 | 1710-2110 | 824-869 | 2500-2620 | 880-925 | 698-728 | 777-746 | 832-791 |
| Comparative example | TRP | 8.34 | 8.89 | 8.05 | 8.58 | 4.30 | 3.13 | 4.43 | 2.10 | 2.85 | 2.43 |
| | TIS | 82.2 | 83.9 | 83.6 | 79.3 | 78.6 | 77.8 | 78.6 | 79.1 | 76.9 | 78.2 |
| Example | TRP | 8.92 | 8.99 | 8.08 | 8.40 | 4.30 | 3.85 | 5.18 | 1.84 | 2.79 | 3.13 |
| | TIS | 81.7 | 83.6 | 83.8 | 81.6 | 79.3 | 76.1 | 79.7 | 79.1 | 77.0 | 78.6 |
| Δ | TRP | 0.58 | B 02 | B 03 | B 04 | B 05 | B 07 | B 08 | B 12 | B 13 | B 20 |
| | TIS | -0.5 | -0.3 | 0.2 | 2.3 | 0.8 | -1.7 | 1.1 | 0.0 | 0.1 | 0.4 |

FIG. 10B

ELECTRONIC DEVICE WITH SIDE FRAME SERVING AS AN ANTENNA AND HEAT DISSIPATION MEMBER

CROSS-REFERENCE TO RELATED APPLICATIONS

This application is a continuation of International Application No. PCT/KR2022/004036 designating the United States, filed on Mar. 23, 2022, in the Korean Intellectual Property Receiving Office and claiming priority to Korean Patent Application No. 10-2021-0065214, filed on May 21, 2021, in the Korean Intellectual Property Office, the disclosures of each of which are incorporated by reference herein in their entireties.

FIELD

Background

The disclosure relates to an electronic device.

Description of Related Art

The development of electronic technology has accelerated the development and distribution of electronic products of various types. For example, wearable electronic devices, devices worn on the body, have been further spread.

A wearable electronic device may be formed in a relatively small size to be easily worn on a body. To provide a communication function to such a limited product size of a wearable electronic device, a conductor (e.g., a bracket, a display, a metal frame, etc.) of the device may be used as an antenna in many cases. In addition, the wearable electronic device may generate a great amount of internal heat during communication in a weak electric field, and there is thus a need for a structure that may externally dissipate the heat to the outside.

SUMMARY

Embodiments of the disclosure provide an electronic device having heat dissipation performance improved using an externally exposed metal frame not only as an antenna but also as a heat dissipation member.

Embodiments of the disclosure provide an electronic device in which the metal frame of the electronic device may be used as an antenna and a heat sink.

Embodiments of the disclosure provide an electronic device implementing a heat dissipation path while maintaining antenna performance of the electronic device may improve heat dissipation performance.

According to various example embodiments, an electronic device may include: a housing including a front plate, a rear plate facing an opposite direction to the front plate, and a side frame surrounding a space between the front plate and the rear plate; and a printed circuit board (PCB) disposed in the space and including a front-end module (FEM) and a heating element comprising thermally conductive material mounted thereon, wherein the side frame may be segmented into at least a first metal portion and a second metal portion, wherein, between the first metal portion and the second metal portion, a segmentation member comprising a non-conductive material may be disposed, and wherein the first metal portion may be electrically connected to the FEM, and the second metal portion may be connected to the heating element using heat transfer members comprising a thermal interface material.

According to various example embodiments, an electronic device may include: a housing including a front plate, a rear plate facing an opposite direction to the front plate, and a side frame surrounding a space between the front plate and the rear plate; and a printed circuit board (PCB) disposed in the space and including a front-end module (FEM) and a heating element comprising a thermally conductive material mounted thereon, wherein the side frame may be electrically connected to the FEM in a first portion and connected to the heating element using a heat transfer member comprising a thermal interface material in a second portion.

According to various example embodiments, an electronic device may include: a housing including a front plate, a rear plate facing an opposite direction to the front plate, and a side frame surrounding a space between the front plate and the rear plate; and a printed circuit board (PCB) disposed in the space and including a front end module (FEM) and a heating element comprising a thermally conductive material mounted thereon, wherein the side frame may be segmented into at least a first metal portion and a second metal portion in a front-back direction, wherein, between the first metal portion and the second metal portion, a segmentation member comprising a non-conductive material may be disposed, wherein the first metal portion may be disposed before the second metal portion and may be electrically connected to the FEM configured to function as an antenna, and the second metal portion may have a greater volume than the first metal portion and may be connected to the heating element using heat transfer members comprising a thermal interface material configured to function as a heat sink.

According to various example embodiments, using a metal frame exposed to the outside of an electronic device as an antenna and a heat sink may implement a heat dissipation path connected from the inside to the outside of the device while maintaining antenna performance and may thus improve heat dissipation performance.

BRIEF DESCRIPTION OF THE DRAWINGS

The above and other aspects, features and advantages of certain embodiments of the present disclosure will be more apparent from the following detailed description, taken in conjunction with the accompanying drawings, in which:

FIG. 10B is a table illustrating a result of testing antenna performance of an electronic device to which a heat dissipation path is applied according to various embodiments;

DETAILED DESCRIPTION

Figure 1:
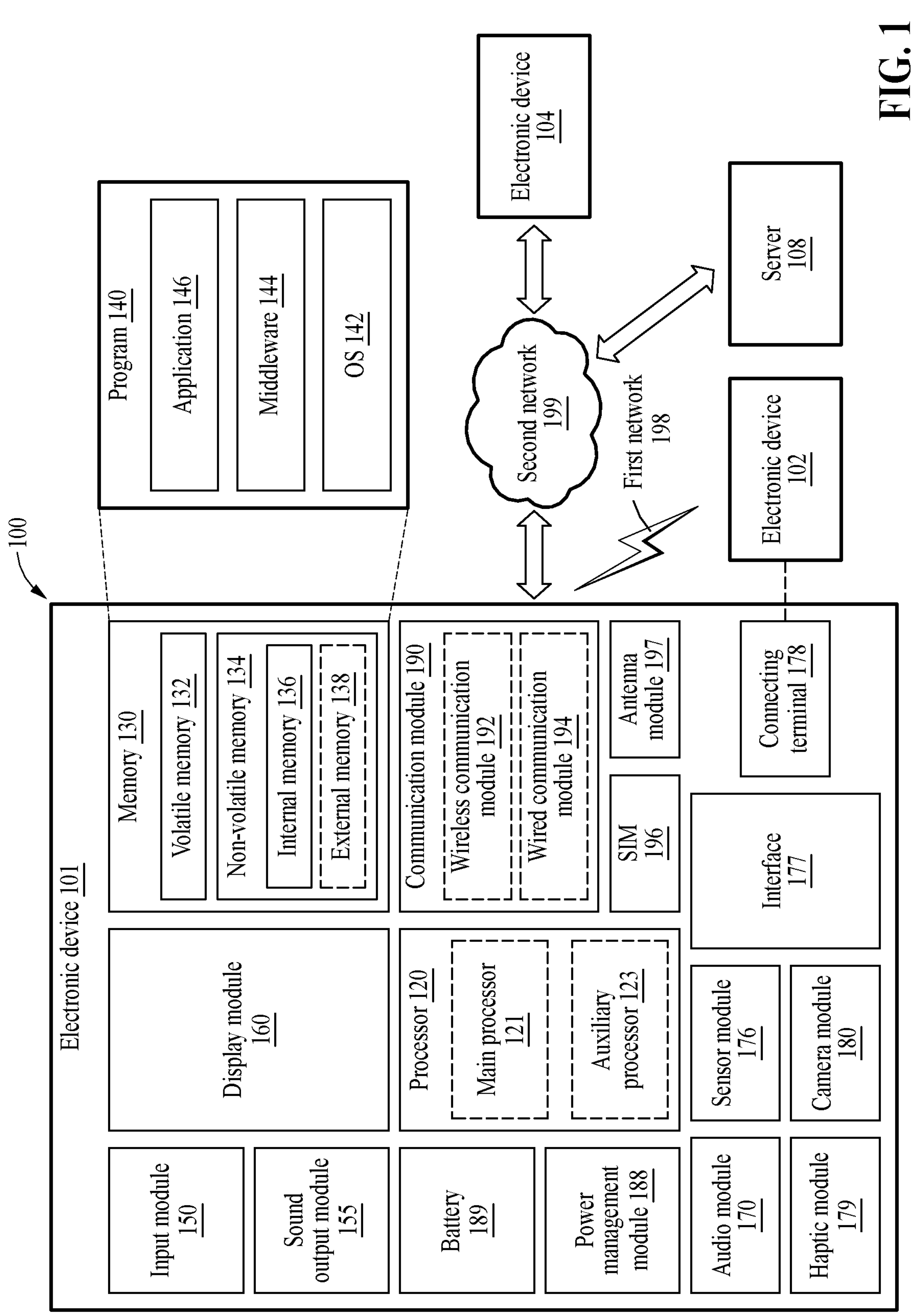
FIG. 1 is a block diagram illustrating an example electronic device in a network environment according to various example embodiments.

Hereinafter, various example embodiments will be described in greater detail with reference to the accompanying drawings. When describing the example embodiments with reference to the accompanying drawings, like reference numerals refer to like elements and a description related thereto may not be repeated. A component or element in an example embodiment will be described using the same name in other embodiments when it has the same or common functions. Unless otherwise noted, the description of one embodiment is applicable to the other embodiments, and repeated descriptions thereof may not be repeated for conciseness. It should be noted that, if a component or element is described as "connected," "coupled," or "joined" to another component or element, it may be directly (e.g., in contact with the other component or element) "connected," "coupled," or "joined" to the other component or element, or there may reasonably be one or more other components or elements intervening therebetween.

FIG. 1 is a block diagram illustrating an example electronic device 101 in a network environment 100 according to various example embodiments. Referring to FIG. 1, the electronic device 101 in the network environment 100 may communicate with an electronic device 102 via a first network 198 (e.g., a short-range wireless communication network), or communicate with at least one of an electronic device 104 and a server 108 via a second network 199 (e.g., a long-range wireless communication network). The electronic device 101 may communicate with the electronic device 104 via the server 108. The electronic device 101 may include a processor 120, a memory 130, an input module 150, a sound output module 155, a display module 160, an audio module 170, and a sensor module 176, an interface 177, a connecting terminal 178, a haptic module 179, a camera module 180, a power management module 188, a battery 189, a communication module 190, a subscriber identification module (SIM) 196, or an antenna module 197. In various embodiments, at least one (e.g., the connecting terminal 178) of the above components may be omitted from the electronic device 101, or one or more other components may be added to the electronic device 101. In various embodiments, some (e.g., the sensor module 176, the camera module 180, or the antenna module 197) of the components may be integrated as a single component (e.g., the display module 160).

The processor 120 may execute, for example, software (e.g., a program 140) to control at least one other component (e.g., a hardware or software component) of the electronic device 101 connected to the processor 120, and may perform various data processing or computation. According to an example embodiment, as at least a part of data processing or computation, the processor 120 may store a command or data received from another component (e.g., the sensor module 176 or the communication module 190) in a volatile memory 132, process the command or data stored in the volatile memory 132, and store resulting data in a non-volatile memory 134. The processor 120 may include a main processor 121 (e.g., a central processing unit (CPU) or an application processor (AP)) or an auxiliary processor 123 (e.g., a graphics processing unit (GPU), a neural processing unit (NPU), an image signal processor (ISP), a sensor hub processor, or a communication processor (CP)) that is operable independently from or in conjunction with, the main processor 121. For example, when the electronic device 101 includes the main processor 121 and the auxiliary processor 123, the auxiliary processor 123 may be adapted to consume less power than the main processor 121 or to be specific to a specified function. The auxiliary processor 123 may be implemented separately from the main processor 121 or as a part of the main processor 121.

The auxiliary processor 123 may control at least some of functions or states related to at least one (e.g., the display module 160, the sensor module 176, or the communication module 190) of the components of the electronic device 101, instead of the main processor 121 while the main processor 121 is in an inactive (e.g., sleep) state or along with the main processor 121 while the main processor 121 is an active state (e.g., executing an application). The auxiliary processor 123 (e.g., an ISP or a CP) may be implemented as a portion of another component (e.g., the camera module 180 or the communication module 190) that is functionally related to the auxiliary processor 123. The auxiliary processor 123 (e.g., an NPU) may include a hardware structure specifically for artificial intelligence (AI) model processing. An AI model may be generated by machine learning. The learning may be performed by, for example, the electronic device 101, in which the AI model is performed, or performed via a separate server (e.g., the server 108). Learning algorithms may include, but are not limited to, for example, supervised learning, unsupervised learning, semi-supervised learning, or reinforcement learning. The AI model may include a plurality of artificial neural network layers. An artificial neural network may include, for example, a deep neural network (DNN), a convolutional neural network (CNN), a recurrent neural network (RNN), a restricted Boltzmann machine (RBM), a deep belief network (DBN), and a bidirectional recurrent deep neural network (BRDNN), a deep Q-network, or a combination of two or more thereof, but is not limited thereto. The AI model may alternatively or additionally include a software structure other than the hardware structure.

The memory 130 may store various pieces of data used by at least one component (e.g., the processor 120 or the sensor module 176) of the electronic device 101. The various pieces of data may include, for example, software (e.g., the program 140) and input data or output data for a command related thereto. The memory 130 may include the volatile memory 132 or the non-volatile memory 134.

The program 140 may be stored as software in the memory 130 and may include, for example, an operating system (OS) 142, middleware 144, or an application 146.

The input module 150 may receive, from outside (e.g., a user) the electronic device 101, a command or data to be used by another component (e.g., the processor 120) of the electronic device 101. The input module 150 may include, for example, a microphone, a mouse, a keyboard, a key (e.g., a button), or a digital pen (e.g., a stylus pen).

The sound output module 155 may output a sound signal to the outside of the electronic device 101. The sound output module 155 may include, for example, a speaker or a receiver. The speaker may be used for general purposes, such as playing multimedia or playing a recording. The receiver may be used to receive an incoming call. The receiver may be implemented separately from the speaker or as a part of the speaker.

The display module 160 may visually provide information to the outside (e.g., a user) of the electronic device 101. The display module 160 may include, for example, a display, a hologram device, or a projector, and a control circuitry to control its corresponding one of the displays, the hologram device, and the projector. The display module 160 may include a touch sensor adapted to sense a touch, or a pressure sensor adapted to measure an intensity of a force of the touch.

The audio module 170 may convert sound into an electric signal or vice versa. The audio module 170 may obtain the sound via the input module 150 or output the sound via the sound output module 155 or an external electronic device (e.g., the electronic device 102, such as a speaker or headphones) directly or wirelessly connected to the electronic device 101.

The sensor module 176 may detect an operational state (e.g., power or temperature) of the electronic device 101 or an environmental state (e.g., a state of a user) external to the electronic device 101 and generate an electric signal or data value corresponding to the detected state. The sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used by the electronic device 101 to couple with an external electronic device (e.g., the electronic device 102) directly (e.g., by wire) or wirelessly. The interface 177 may include, for example, a high-definition multimedia interface (HDMI), a universal serial bus (USB) interface, a secure digital (SD) card interface, or an audio interface.

The connecting terminal 178 may include a connector via which the electronic device 101 may physically connect to an external electronic device (e.g., the electronic device 102). The connecting terminal 178 may include, for example, an HDMI connector, a USB connector, an SD card connector, or an audio connector (e.g., a headphones connector).

The haptic module 179 may convert an electric signal into a mechanical stimulus (e.g., a vibration or a movement) or an electrical stimulus, which may be recognized by a user via their tactile sensation or kinesthetic sensation. The haptic module 179 may include, for example, a motor, a piezoelectric element, or an electric stimulator.

The camera module 180 may capture a still image and moving images. The camera module 180 may include one or more lenses, image sensors, ISPs, and flashes.

The power management module 188 may manage power supplied to the electronic device 101. The power management module 188 may be implemented as, for example, at least a part of a power management integrated circuit (PMIC).

The battery 189 may supply power to at least one component of the electronic device 101. The battery 189 may include, for example, a primary cell, which is not rechargeable, a secondary cell, which is rechargeable, or a fuel cell.

The communication module 190 may support establishing a direct (e.g., wired) communication channel or a wireless communication channel between the electronic device 101 and an external electronic device (e.g., the electronic device 102, the electronic device 104, or the server 108) and performing communication via the established communication channel. The communication module 190 may include one or more CPs that are operable independently from the processor 120 (e.g., an AP) and that support direct (e.g., wired) communication or wireless communication. The communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device, for example, the electronic device 104, via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a $5^{th}$ generation (5G) network, a next-generation communication network, the Internet, or a computer network (e.g., an LAN or a wide area network (WAN)). These various types of communication modules may be implemented as a single component (e.g., a single chip), or may be implemented as multiple components (e.g., multiple chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network after a $4^{th}$ generation (4G) network, and a next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., an mmWave band) to achieve, e.g., a high data transmission rate. The wireless communication module 192 may support various technologies for securing performance on a high-frequency band, such as, e.g., beamforming, massive multiple-input and multiple-output (MIMO), full dimensional MIMO (FD-MIMO), an array antenna, analog beamforming, or a large-scale antenna. The wireless communication module 192 may support various requirements specified in the electronic device 101, an external electronic device (e.g., the electronic device 104), or a network system (e.g., the second network 199). The wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., an external electronic device) of the electronic device 101. The antenna module 197 may include an antenna including a radiating element including a conductive material or a conductive pattern formed in or on a substrate (e.g., a printed circuit board (PCB)). The antenna module 197 may include a plurality of antennas (e.g., an antenna array). In such a case, at least one antenna appropriate for a communication scheme used in a communication network, such as the first network 198 or the second network 199, may be selected by, for example, the communication module 190 from the plurality of antennas. The signal or power may be transmitted or received between the communication module 190 and the external electronic device via the at least one selected antenna. According to an example embodiment, another component (e.g., a radio frequency integrated circuit (RFIC)) other than the radiating element may be additionally formed as a part of the antenna module 197.

According to various example embodiments, the antenna module 197 may form an mmWave antenna module. The mmWave antenna module may include a PCB, an RFIC on a first surface (e.g., a bottom surface) of the PCB or adjacent to the first surface of the PCB and capable of supporting a designated high-frequency band (e.g., a mmWave band), and a plurality of antennas (e.g., an antenna array) disposed on a second surface (e.g., a top or a side surface) of the PCB, or adjacent to the second surface of the PCB and capable of transmitting or receiving signals in the designated high-frequency band.

At least some of the above-described components may be coupled mutually and exchange signals (e.g., commands or data) therebetween via an inter-peripheral communication scheme (e.g., a bus, general-purpose input and output (GPIO), serial peripheral interface (SPI), or mobile industry processor interface (MIPI)).

According to an example embodiment, commands or data may be transmitted or received between the electronic device 101 and the external electronic device (e.g., the electronic device 104) via the server 108 coupled with the second network 199. Each of the external electronic devices (e.g., the electronic device 102 or 104) may be a device of the same type as or a different type from the electronic device 101. All or some of operations to be executed by the electronic device 101 may be executed by one or more of the external electronic devices (e.g., the electronic devices 102 and 104 and the server 108). For example, if the electronic device 101 needs to perform a function or a service automatically, or in response to a request from a user or another device, the electronic device 101, instead of, or in addition to, executing the function or service, may request one or more external electronic devices to perform at least a part of the function or service. The one or more external electronic devices receiving the request may perform the at least part of the function or the service requested, or an additional function or an additional service related to the request and may transfer a result of the performance to the electronic device 101. The electronic device 101 may provide the result, with or without further processing of the result, as at least part of a response to the request. To that end, cloud computing, distributed computing, mobile edge computing (MEC), or client-server computing technology may be used, for example. The electronic device 101 may provide ultra-low latency services using, e.g., distributed computing or MEC. According to an embodiment, the external electronic device (e.g., the electronic device 104) may include an Internet-of-things (IoT) device. The server 108 may be an intelligent server using machine learning and/or a neural network. The external electronic device (e.g., the electronic device 104) or the server 108 may be included in the second network 199. The electronic device 101 may be applied to intelligent services (e.g., a smart home, a smart city, a smart car, or healthcare) based on communication technology or IoT-related technology.

Figure 2A:
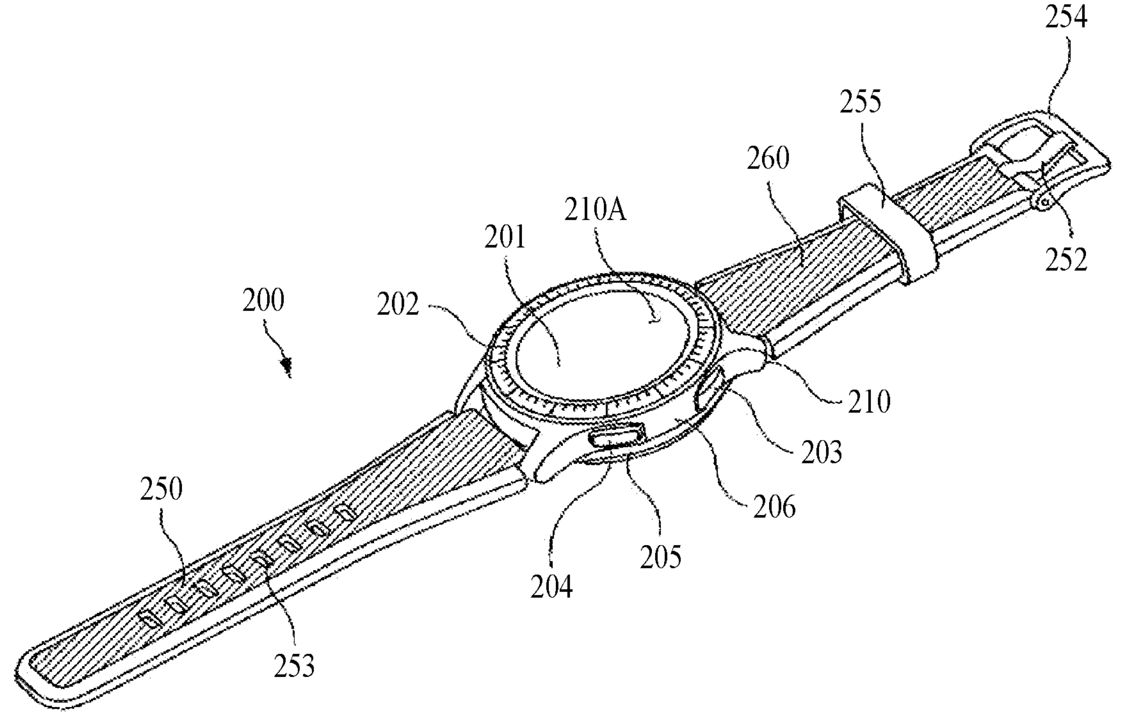
FIGS. 2A and 2B are front and rear perspective views, respectively, of an electronic device according to various embodiments.
Figure 2B:
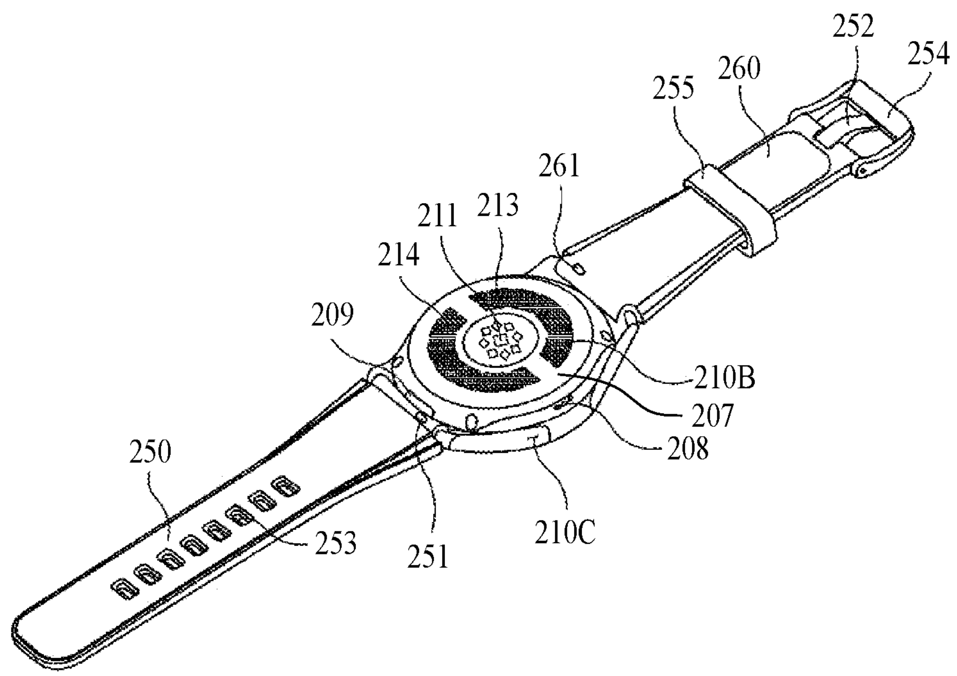

Referring to FIGS. 2A and 2B, an electronic device 200 (e.g., the electronic device 101 of FIG. 1) according to an example embodiment may include a housing 210 including a first surface (or a front surface) 210A, a second surface (or a rear surface) 210B, and a side surface 210C surrounding a space between the first surface 210A and the second surface 210B, and fastening members 250 and 260 connected to at least a portion of the housing 210 and configured to detachably attach the electronic device 200 to a body part (e.g., a wrist or an ankle) of a user. In another example embodiment (not shown), a housing may also refer to a structure which forms a portion of the first surface 210A, the second surface 210B, and the side surface 210C of FIG. 2A. According to an example embodiment, the first surface 210A may be formed by a front plate 201 (e.g., a glass plate or a polymer plate including various coating layers) of which at least a portion is substantially transparent. The second surface 210B may be formed by a rear plate 207 that is substantially opaque. The rear plate 207 may be formed of, for example, coated or tinted glass, ceramic, polymer, metal (e.g., aluminum, stainless steel (STS), or magnesium), or a combination of at least two thereof. The side surface 210C may be coupled to the front plate 201 and the rear plate 207 and may be formed by a side bezel structure 206 (or a "side member") including metal and/or polymer. In an example embodiment, the rear plate 207 and the side bezel structure 206 may be integrally formed and may include the same material (e.g., a metal material such as aluminum). The fastening members 250 and 260 may be formed of various materials and in various shapes. A woven fabric, leather, rubber, urethane, metal, ceramic, or a combination of at least two thereof may be used to form an integral and a plurality of unit links to flow with each other.

According to an example embodiment, the electronic device 200 may include at least one of a display 220 (refer to FIG. 3), audio modules 205 and 208, a sensor module 211, key input devices 202, 203, and 204, and a connector hole 209. According to another example embodiment, the electronic device 200 may not include at least one (e.g., the key input devices 202, 203, and 204, the connector hole 209, or the sensor module 211) of the components, or additionally include other components.

The display 220 may be exposed (e.g., visible) through, for example, a considerable portion of the front plate 201. The display 220 may have a shape corresponding to a shape of the front plate 201, and may have various shapes such as a circle, an oval, or a polygon. The display 220 may be coupled to or disposed adjacent to a touch sensing circuit, a pressure sensor capable of measuring an intensity (or pressure) of a touch, and/or a fingerprint sensor. As used herein with reference to the display, the terms "exposed", "visible" and "visually exposed" may used interchangeably and include a display having a front plate, cover plate, protective layer, or the like disposed on the display.

The audio modules 205 and 208 may include a microphone hole 205 and a speaker hole 208. The microphone hole 205 may have therein a microphone for obtaining an external sound and have a plurality of microphones arranged to sense a direction of a sound in some example embodiments. The speaker hole 208 may be used as an external speaker and a receiver for calls. In some example embodiments, the speaker hole 208 and the microphone hole 205 may be implemented as a single hole, or a speaker (e.g., a piezo speaker) may be included without the speaker hole 208.

The sensor module 211 may generate an electrical signal or a data value corresponding to an internal operating state of the electronic device 200 or an external environmental state. The sensor module 211 may include, for example, a biometric sensor module 211 (e.g., a heart rate monitor (HRM) sensor) disposed on the second surface 210B of the housing 210. The electronic device 200 may further include at least one of sensor modules (not shown), for example, a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor.

The sensor module 211 may include electrode areas 213 and 214 that form a portion of the surface of the electronic device 200 and a biosignal detection circuit (not shown) electrically connected to the electrode areas 213 and 214. For example, the electrode areas 213 and 214 may include a first electrode area 213 and a second electrode area 214 disposed on the second surface 210B of the housing 210. The sensor module 211 may be configured such that the electrode areas 213 and 214 obtain electrical signals from a part of a body of a user and the biosignal detection circuit detects biometric information of the user based on the electrical signals.

The key input devices 202, 203, and 204 may include a wheel key 202 disposed on the first surface 210A of the housing 210 and rotatable in at least one direction, and/or side key buttons 203 and 204 disposed on the side surface 210C of the housing 210. The wheel key may have a shape corresponding to the shape of the front plate 201. In an example embodiment, the electronic device 200 may not include some or all of the key input devices 202, 203, and 204, and some or all of the key input devices 202, 203, and 204 that are not included may be implemented in other forms such as soft keys on the display 220. The connector hole 209 may accommodate a connector (e.g., a universal serial bus (USB) connector) for transmitting and receiving power and/or data to and from an external electronic device and may include another connector hole (not shown) that accommodates a connector for transmitting and receiving an audio signal to and from an external electronic device. The electronic device 200 may further include, for example, a connector cover (not shown) that covers at least a portion of the connector hole 209 and prevents and/or reduces an inflow of foreign substances into the connector hole 209.

The fastening members 250 and 260 may be detachably attached to at least a portion of the housing 210 using locking members 251 and 261. The fastening members 250 and 260 may include one or more of a fixing member 252, a fixing member fastening hole 253, a band guide member 254, and a band fixing ring 255.

The fixing member 252 may be configured to fix the housing 210 and the fastening members 250 and 260 to a body part (e.g., a wrist, an ankle, etc.) of the user. The fixing member fastening hole 253 may correspond to the fixing member 252 to fix the housing 210 and the fastening members 250 and 260 to the body part of the user. The band guide member 254 may be configured to limit a range of a movement of the fixing member 252 when the fixing member 252 is fastened to the fixing member fastening hole 253, so that the fastening members 250 and 260 are closely attached to the body part of the user. The band fixing ring 255 may limit a range of a movement of the fastening members 250 and 260 while the fixing member 252 and the fixing member fastening hole 253 are fastened to each other.

Figure 3:
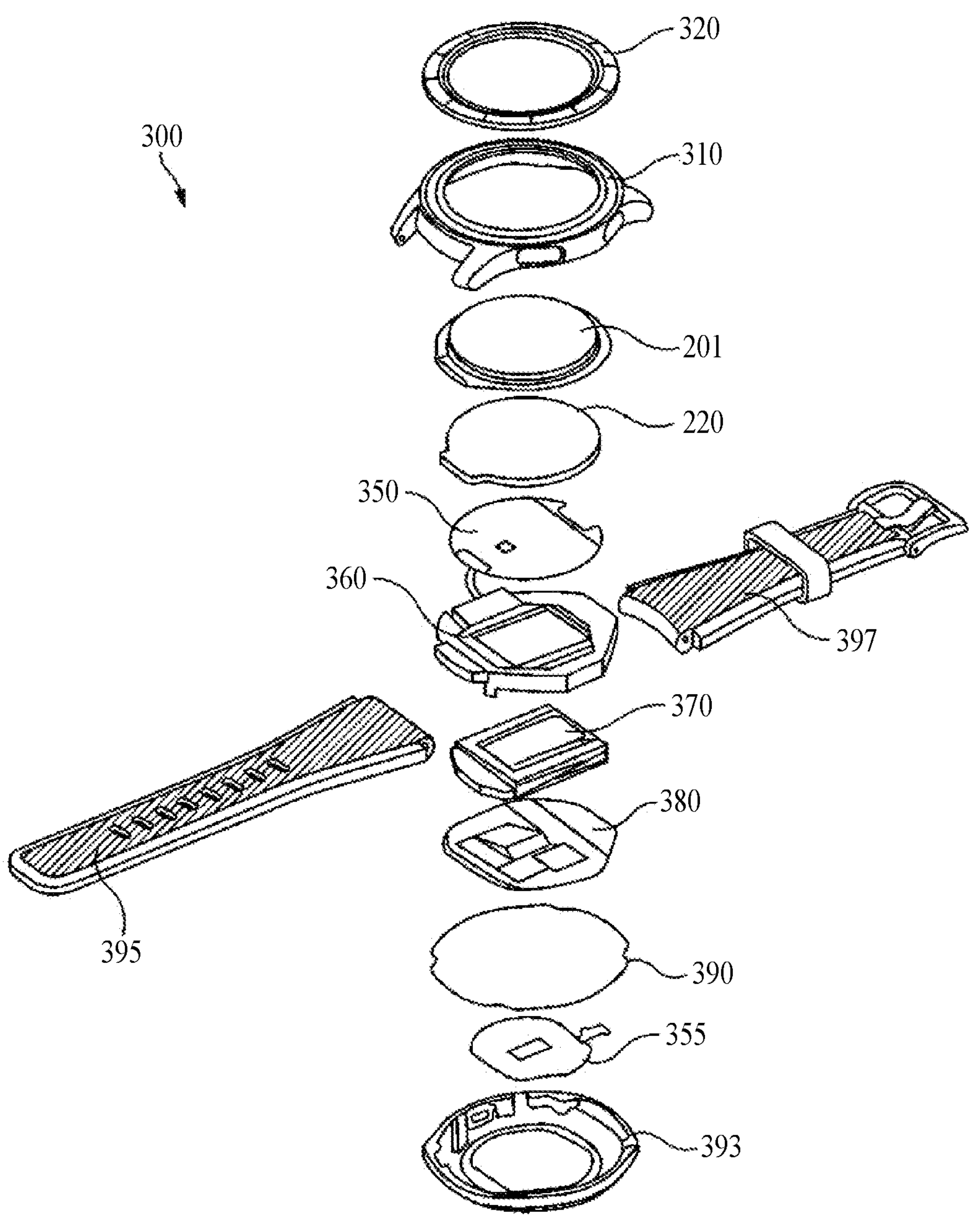
FIG. 3 is an exploded perspective view of an electronic device according to various embodiments.

Referring to FIG. 3, an electronic device 300 (e.g., the electronic device 101 of FIG. 1 or the electronic device 200 of FIGS. 2A and 2B) may include a side bezel structure 310, a wheel key 320, a front plate 201, a display 220, a first antenna 350, a second antenna 355, a support member 360 (e.g., a bracket), a battery 370, a PCB 380, a sealing member 390, a rear plate 393, and fastening members 395 and 397. At least one of the components of the electronic device 300 may be the same as or similar to at least corresponding one of the components of the electronic device of FIG. 1 and the electronic device 200 of FIGS. 2A and 2B, and thus a repeated description thereof may not be repeated here. The support member 360 may be disposed inside the electronic device 300 and connected to the side bezel structure 310 or be integrally formed with the side bezel structure 310. The support member 360 may be formed of, for example, a metal material and/or a non-metal material (e.g., polymer). The display 220 may be connected to one surface of the support member 360, and the PCB 380 may be connected to the other surface of the support member 360. On the PCB 380, a processor, a memory, and/or an interface may be provided. The processor may include, for example, one or more of a CPU, a GPU, an AP, a sensor processor, or a CP.

The memory may include, for example, a volatile memory or a non-volatile memory. The interface may include, for example, a high-definition multimedia interface (HDMI), a USB interface, an SD card interface, or an audio interface. For example, the interface may electrically or physically connect the electronic device 300 to an external electronic device, and may include a USB connector, an SD card/multimedia card (MMC) connector, or an audio connector.

The battery 370, which is a device for supplying power to at least one component of the electronic device 300, may include, for example, a non-rechargeable primary battery, a rechargeable secondary battery, or a fuel cell. For example, at least a portion of the battery 370 may be disposed on substantially the same plane as the PCB 380. The battery 370 may be disposed integrally inside the electronic device 200 or disposed detachably from the electronic device 200.

The first antenna 350 may be disposed between the display 220 and the support member 360. The first antenna 350 may include, for example, a near-field communication (NFC) antenna, a wireless charging antenna, and/or a magnetic secure transmission (MST) antenna. For example, the first antenna 350 may perform short-range communication with an external device, wirelessly transmit and receive power required for charging, or transmit a magnetism-based signal including a short-range communication signal or payment data. In another example embodiment, an antenna structure may be formed by a portion of the side bezel structure 310 and/or the support member 360 or a combination thereof.

The second antenna 355 may be disposed between the PCB 380 and the rear plate 393. The antenna 355 may include, for example, an NFC antenna, a wireless charging antenna, and/or an MTS antenna. For example, the second antenna 355 may perform short-range communication with an external device, wirelessly transmit and receive power required for charging, or transmit a magnetism-based signal including a short-range communication signal or payment data. In another example embodiment, an antenna structure may be formed by a portion of the side bezel structure 310 and/or the rear plate 393 or a combination thereof.

The sealing member (e.g., a seal) 390 may be disposed between the side bezel structure 310 and the rear plate 393. The sealing member 390 may be configured to prevent and/or reduce moisture and foreign substances from flowing into a space surrounded by the side bezel structure 310 and the rear plate 393 from the outside.

Figure 4A:
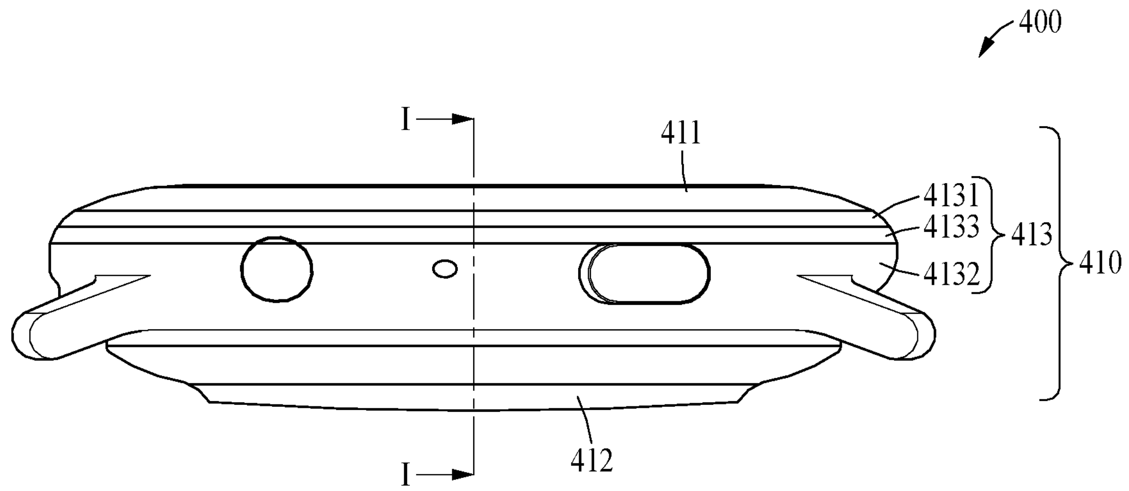
FIG. 4A is a diagram illustrating a side view of an electronic device according to various embodiments.
Figure 4B:
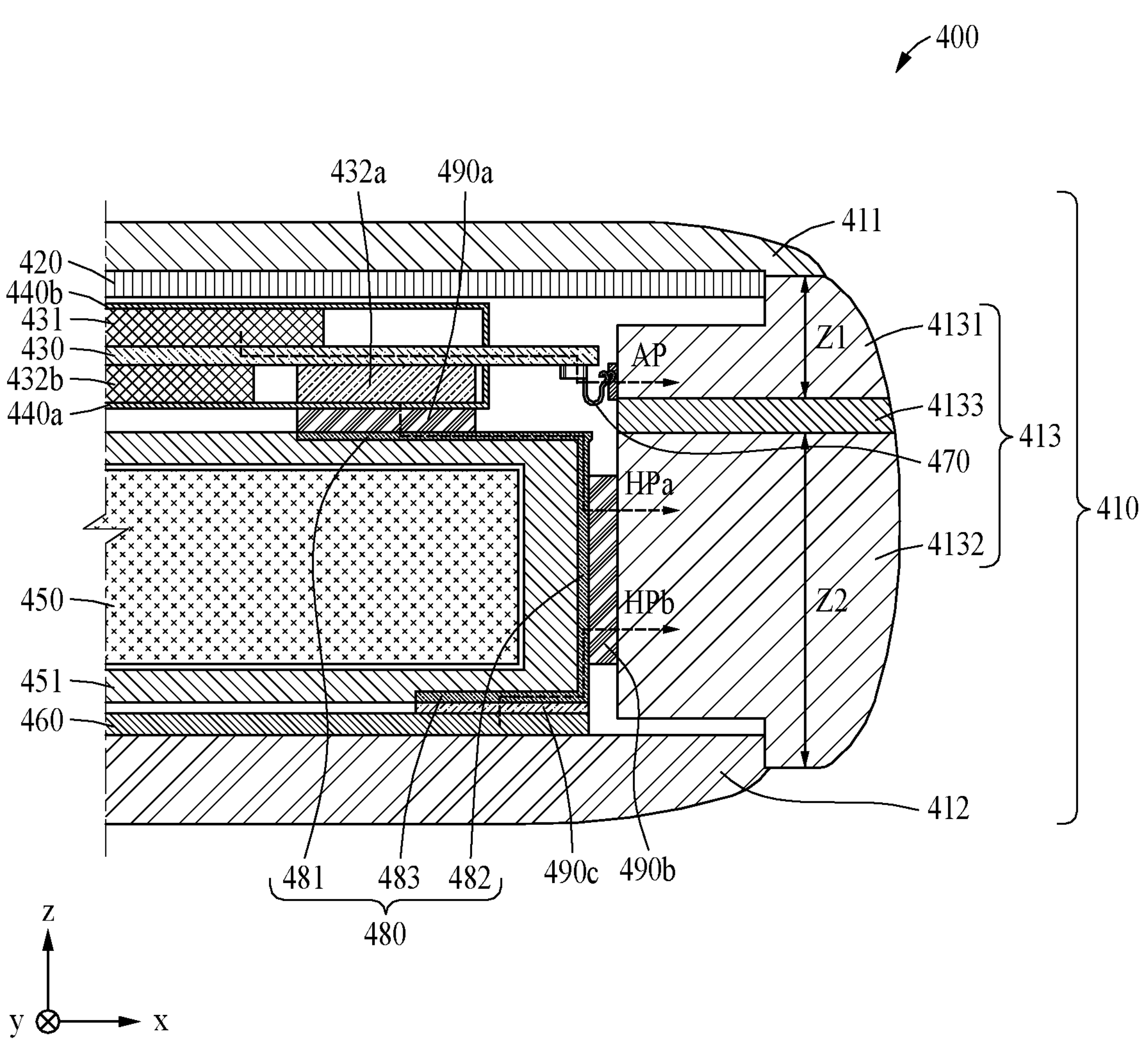
FIG. 4B is a cross-sectional view of one side taken along a line I-I of FIG. 4A according to various embodiments.

FIG. 4A is a diagram illustrating a side view of an electronic device according to various embodiments. FIG. 4B is a cross-sectional view of one side taken along a line I-I of FIG. 4A according to various embodiments.

Referring to FIGS. 4A and 4B, an electronic device 400 (e.g., the electronic device 101 of FIG. 1, the electronic device 200 of FIGS. 2A and 2B, or the electronic device 300 of FIG. 3) according to an example embodiment may be an electronic device that may be worn on a body. For example, the electronic device 400 may be a smartwatch. However, the type of electronic device 400 is not limited thereto. The electronic device 400 may have heat dissipation performance that is improved through heat dissipation paths HPa and HPb.

In an example embodiment, the electronic device 400 may include a housing 410 (e.g., the housing 210 of FIGS. 2A and 2B), a display 420 (e.g., the display module 160 of FIG. 1 or the display 220 of FIGS. 2A and 2B), a PCB 430 (e.g., the PCB 380 of FIG. 3), shield cans 440*a* and 440*b*, a battery 450 (e.g., the battery 189 of FIG. 1 or the battery 370 of FIG. 3), a wireless charging coil 460, a connecting member 470, a heat transfer structure 480, and heat transfer members 490*a*, 490*b*, and 490*c*.

The housing 410 may form an exterior of the electronic device 400. To at least a portion of the housing 410, a fastening member (e.g., the fastening members 250 and 260 of FIGS. 2A and 2B or the fastening members 395 and 397 of FIG. 3) configured to detachably attach the electronic device 400 to a body part (e.g., wrist or ankle) of a user may be connected.

In an example embodiment, the housing 410 may include a front plate 411 (e.g., the front plate 201 of FIG. 2A), a rear plate 412 (e.g., the rear plate 207 of FIG. 2B or the rear plate 393 of FIG. 3), and a side frame 413 (e.g., the side bezel structure 206 of FIG. 2A or the side bezel structure 310 of FIG. 3).

In an example embodiment, the front plate 411 may form an outer front surface of the electronic device 400. The front plate 411 may be disposed to face a front side (e.g., in a +z axis direction). For example, a portion of the front plate 411 may be formed to be substantially transparent.

In an example embodiment, the rear plate 412 may form an outer rear surface of the electronic device 400. The rear plate 412 may be disposed to face a rear side opposite to the front plate 411 (e.g., in a −z axis direction). For example, the rear plate 412 may be formed to be substantially opaque.

In an example embodiment, the side frame 413 may form an outer side surface of the electronic device 400. The side frame 413 may surround a space between the front plate 411 and the rear plate 412. In the space formed by the front plate 411, the rear plate 412, and the side frame 413, internal components (e.g., the display 420, the PCB 430, the shield cans 440*a* and 440*b*, the battery 450, the wireless charging coil 460, the connecting member 470, the heat transfer structure 480, and the heat transfer members 490*a*, 490*b*, and 490*c*) of the electronic device 400 may be disposed. At least a portion of the side frame 413 may be formed of metal. The side frame 413 will be described in detail below.

Although FIGS. 4A and 4B illustrate the housing 410 as divided into the front plate 411, the rear plate 412, and the side frame 413 surrounding the front, rear, and side surfaces, respectively, this is provided only as an example. For example, the side frame 413 may be integrally formed with the front plate 411 and/or the rear plate 412.

In an example embodiment, the display 420 may visually provide information to the outside (e.g., the user) of the electronic device 400. The display 420 may be disposed behind the front plate 411 (e.g., in the −z-axis direction).

In an example embodiment, the PCB 430 may be disposed in an inner space of the housing 410. For example, the PCB 430 may be disposed behind the display 420 (e.g., in the −z-axis direction) and before the battery 450 (e.g., in the +z-axis direction). On the PCB 430, a processor, a memory, and/or a communication module may be disposed. For example, on the PCB 430, a processor, a front-end module (FEM) 431, and/or heating elements 432*a* and 432*b* such as a power management integrated circuit (PMIC) may be mounted. The heating elements 432*a* and 432*b* may refer to elements that generate heat while in use. For example, the heating elements 432*a* and 432*b* may be at least one of a power amplifier module (PAM), a power unit, an application processor (AP), and a communication processor (CP). However, examples are not limited thereto, and a type of heating element is not limited thereto. Although two heating elements (e.g., 432*a* and 432*b*) are shown in FIG. 4B, this is provided only as an example, and the number of heating elements is not limited thereto. In addition, positions of the FEM 431 and the heating elements 432*a* and 432*b* shown in FIG. 4B are provided only as an example, and the FEM 431 and the heating elements 432*a* and 432*b* may be disposed at various positions on the front or rear surface of the PCB 430.

Figure 5:
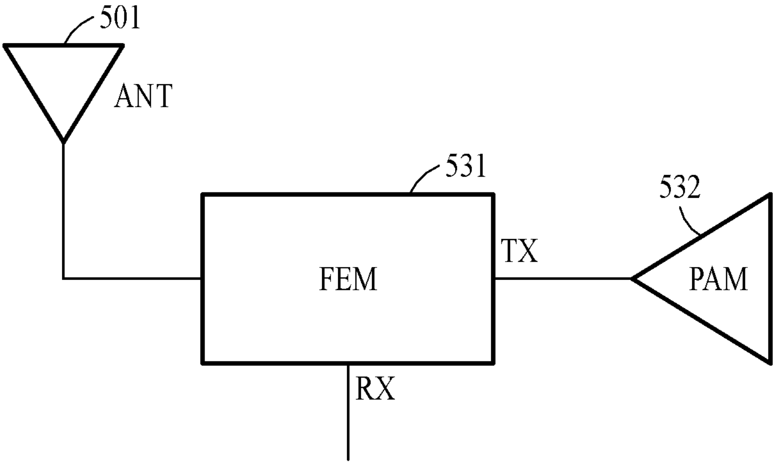
FIG. 5 is a block diagram illustrating at least a portion of a radio frequency (RF) circuit according to various embodiments.

FIG. 5 is a block diagram illustrating at least a portion of a radio frequency (RF) circuit according to various embodiments. Referring to FIG. 5, a FEM 531 (e.g., the FEM 431 of FIG. 4B) may be a transmitting and receiving device configured to control radio signals. The FEM 531 may transmit a transmission signal to at least one antenna 501 or receive a reception signal through the at least one antenna 501. According to an example embodiment, the antenna 501 may be at least a partial area of a metal portion of a side frame (e.g., the side frame 413 of FIGS. 4A and 4B). According to an example embodiment, the antenna 501 may be an antenna (e.g., the first antenna 350 of FIG. 3) disposed inside a housing. The FEM 531 may be connected to a PAM 532 (e.g., the first heating element 432*a* of FIG. 4B) to amplify the transmission signal. The FEM 531 may be connected to a low noise amplifier (LNA) (not shown) to amplify the reception signal. The FEM 531 may be connected to a filter (not shown) to classify a frequency band.

Referring back to FIGS. 4A and 4B, in an example embodiment, elements mounted on the PCB 430 may be surrounded by the shield cans 440*a* and 440*b*. For example, the shield cans 440*a* and 440*b* may surround at least one of the FEM 431 and/or the heating elements 432*a* and 432*b*. For example, the shield cans 440*a* and 440*b* may perform a function of protecting the elements or blocking noise through shielding. Although two shield cans (e.g., 440*a* and 440*b*) are shown in FIG. 4B, this is provided only as an example, and the number of shield cans is not limited thereto. Although FIG. 4B shows that the first shield can 440*a* is connected to the front surface of the PCB 430 and the second shield can 440*b* is connected to the rear surface of the PCB 430, this is provided only as an example, and a position of a shield can is not limited thereto. There may be a heat transfer member (not shown) disposed between the heating elements 432*a* and 432*b* and the shield cans 440*a* and 440*b*.

In an example embodiment, the battery 450 may supply power to at least one component of the electronic device 400. The battery 450 may be disposed in the inner space of the housing 410. For example, the battery 450 may be disposed behind the PCB 430 (e.g., in the −z-axis direction) and before the rear plate 412 (e.g., in the +z-axis direction). The battery 450 may be supported and fixed by a support member 451 (e.g., a bracket). The support member 451 may support at least one surface of the battery 450 with respect to the housing 410. For example, the support member 451 may be formed to surround the front, rear, and side surfaces of the battery 450 as shown in FIG. 4B. However, this is provided only as an example, and the shape and/or type of the support member 451 are not limited thereto.

In an example embodiment, the wireless charging coil 460 may wirelessly charge the battery 450. For example, the wireless charging coil 460 may function as a receiver coil that receives power from an external wireless charging device. The wireless charging coil 460 may be disposed in the inner space of the housing 410. For example, the wireless charging coil 460 may be disposed behind the battery 450 (e.g., in the −z-axis direction) and before the rear plate 412 (e.g., in the +z-axis direction).

In an example embodiment, the side frame 413 may be segmented into at least a first metal portion 4131 and a second metal portion 4132. A segmentation member 4133 may be disposed between the first metal portion 4131 and the second metal portion 4132. That is, the first metal portion 4131 and the second metal portion 4132 may be spaced apart from each other by the segmentation member 4133. The segmentation member 4133 may be formed of an insulating member or a non-conductive member.

In an example embodiment, as shown in FIGS. 4A and 4B, the first metal portion 4131 and the second metal portion 4132 may segment the side frame 413 in a front-back direction (e.g., in the z-axis direction). For example, a segmented surface of the side frame 413 may be a plane substantially parallel to an x-y plane. However, this is provided only as an example, and the side frame 413 may be segmented to have various shapes (e.g., refer to FIGS. 11 and 12). The first metal portion 4131 may be disposed before the second metal portion 4132 (e.g., in the +z-axis direction). The second metal portion 4132 may be formed to have a volume that is greater than that of the first metal portion 4131. For example, a height Z2 of the second metal portion 4132 in the z-axis direction may be greater than a height Z1 of the first metal portion 4131 in the z-axis direction.

In an example embodiment, the first metal portion 4131 may be electrically connected to the FEM 431 to function as an antenna (e.g., the antenna 501 of FIG. 5). For example, the FEM 431 may be electrically connected to the first metal portion 4131 through the connecting member 470 having electrical conductivity. For example, for an electrical connection to the FEM 431, the connecting member 470 may electrically connect a conductive wire (not shown) disposed on the PCB 430 and the first metal portion 4131. By this structure, an antenna path AP that connects the FEM 431, the wire (not shown), the connecting member 470, and the first metal portion 4131 may be formed. However, this is provided only as an example, and other examples that other components are additionally disposed between the components forming the antenna path AP or some of the components forming the antenna path AP is omitted may not be excluded. The connecting member 470 may be implemented as a C-clip, screw, pogo pin, foam, or leaf spring. For example, the connecting member 470 may have elasticity for a stable connection between the PCB 430 and the first metal portion 4131. For example, the connecting member 470 may be disposed to have elasticity substantially in an inward-outward direction (e.g., in an x-axis or y-axis direction).

In an example embodiment, the second metal portion 4132 may be connected to at least one of the heating elements 432*a* and 432*b* to function as a heat dissipation member (e.g., a heat sink). For example, the second metal portion 4132 may be connected to a PAM that consumes a great amount of power and generates a great amount of heat in the RF circuit. Hereinafter, a structure in which the second metal portion 4132 is connected to the first heating element 432*a* will be described as an example with reference to FIG. 4B. However, this is provided only as an example, and a heating element to which the second metal portion 4132 is connected is not limited thereto, and the second metal portion 4132 may also be connected to at least one arbitrary heating element.

In an example embodiment, the second metal portion 4132 may be connected to the first heating element 432*a* through the heat transfer structure 480 and/or the heat transfer members 490*a*, 490*b*, and 490*c*. The heat transfer members 490*a*, 490*b*, and 490*c* may include a thermal interface material (TIM) or a thermally conductive material. For example, the heat transfer members 490*a*, 490*b*, and 490*c* may be provided in the form of pad, film, tape, paste, or liquid (resin). For example, the heat transfer members 490*a*, 490*b*, and 490*c* may be formed of a non-conductive material to prevent and/or reduce the degradation of antenna performance. However, this is provided only as an example, and the heat transfer members 490*a*, 490*b*, and 490*c* are not limited thereto. The heat transfer structure 480 may be formed of a material having high thermal conductivity. For example, the heat transfer structure 480 may be formed of stainless steel (SUS). The heat transfer structure 480 may include at least one of a front structure 481, a side structure 482, and a rear structure 483.

In an example embodiment, the front structure 481 may be disposed on the front surface of the battery 450 and connected to the first heating element 432*a*. For example, the front structure 481 may be disposed along an outer side of a front surface of the support member 451. For example, as shown in FIG. 4B, when the first heating element 432*a* is surrounded by the first shield can 440*a*, the front structure 481 may be connected to the first heating element 432*a* via the first shield can 440*a*. The heat transfer member 490*a* may be disposed between the first heating element 432*a* and the front structure 481. For example, as shown in FIG. 4B, when the first heating element 432*a* is surrounded by the first shield can 440*a*, the heat transfer member 490*a* may be disposed between the front structure 481 and the first shield can 440*a*. The heat transfer member 490*a* disposed between the front structure 481 and the first shield can 440*a* may be, for example, a solid member. A heat transfer member (not shown) may be disposed between the first shield can 440*a* and the first heating element 432*a*. The heat transfer member (not shown) disposed between the first shield can 440*a* and the first heating element 432*a* may be, for example, a liquid resin that allows the heat transfer member (not shown) to come into sufficient contact between elements on the PCB 430.

In an example embodiment, the side structure 482 may extend from the front structure 481 along the side surface of the battery 450. For example, the side structure 482 may be disposed along an outer side of a side surface of the support member 451. The side structure 482 may be connected to the second metal portion 4132. The heat transfer member 490*b* may be disposed between the side structure 482 and the second metal portion 4132. The heat transfer member 490*b* disposed between the side structure 482 and the second metal portion 4132 may be, for example, a solid member.

In an example embodiment, the rear structure 483 may extend from the side structure 482 along the rear surface of the battery 450. For example, the rear structure 483 may be disposed along an outer side of a rear surface of the support member 451. The rear structure 483 may be connected to the wireless charging coil 460. The heat transfer member 490*c* may be disposed between the rear structure 483 and the wireless charging coil 460. The heat transfer member 490*c* disposed between the rear structure 483 and the wireless charging coil 460 may be, for example, a solid member.

In an example embodiment, a first heat dissipation path HPa may be formed by the front structure 481 and the side structure 482. For example, the first heat dissipation path HPa may be formed through the first heating element 432*a*, the heat transfer member (not shown), the first shield can 440*a*, the heat transfer member 490*a*, the front structure 481, the side structure 482, the heat transfer member 490*b*, and the second metal portion 4132. However, this is provided only as an example, and other examples that other components are additionally disposed between the components forming the first heat dissipation path HPa or some of the components forming the first heat dissipation path HPa are omitted may not be excluded. In this case, heat generated from the first heating element 432*a* may be dissipated to the outside through the first heat dissipation path HPa. Accordingly, the second metal portion 4132 may function as a heat sink that dissipates the heat generated in the first heating element 432*a* to the outside.

In an example embodiment, a second heat dissipation path HPb may be formed by the rear structure 483 and the side structure 482. For example, the second heat dissipation path HPb may be formed through the wireless charging coil 460, the heat transfer member 490*c*, the rear structure 483, the side structure 482, the heat transfer member 490*b*, and the second metal portion 4132. However, this is provided only as an example, and other examples that other components are additionally disposed between the components forming the second heat dissipation path HPb or some of the components forming the second heat dissipation path HPb are omitted may not be excluded. In this case, heat generated from the wireless charging coil 460 may be dissipated to the outside through the second heat dissipation path HPb. Accordingly, the second metal portion 4132 may function as a heat sink that dissipates the heat generated in the wireless charging coil 460 to the outside.

In an example embodiment, the structure shown in FIGS. 4A and 4B may allow the first metal portion 4131 and the second metal portion 4132 to be electrically separated from each other by the segmentation member 4133, and allow the first metal portion 4131 and the second metal portion 4132 to function as an antenna and a heat sink, respectively. That is, the antenna path AP and the heat dissipation paths HPa and HPb may not electrically interfere with each other, and even when the second metal portion 4132 functions as a heat sink, the antenna performance of the first metal portion 4131 may be maintained. As the antenna performance is improved when a distance from the body increases, arranging the first metal portion 4131 before the second metal portion 4132 (e.g., in the +z-axis direction) may improve the antenna performance of the first metal portion 4131. In addition, a heat sink performance is improved when a portion exposed to the outside increases, forming the second metal portion 4132 to have a greater volume than that of the first metal portion 4131 may improve the heat sink performance of the second metal portion 4132.

The first heat dissipation path HPa and the second heat dissipation path HPb shown in FIG. 4B are provided only as an example, and a heat dissipation path of the same or similar structure as or to that of the first heat dissipation path HPa and/or the second heat dissipation path HPb may also be formed for an element (e.g., the second heating element 432*b*) that generates heat in addition to the first heating element 432*a* and the wireless charging coil 460.

Figure 6A:
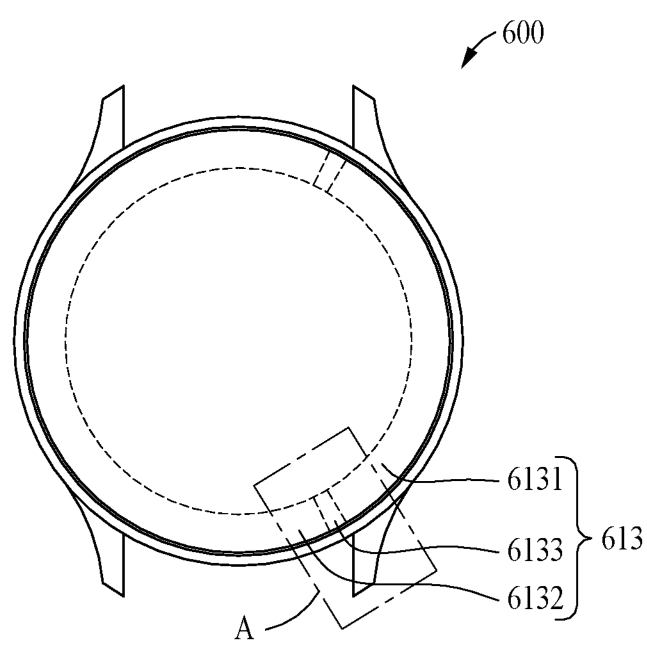
FIG. 6A is a diagram illustrating a top view of an electronic device according to various embodiments
Figure 6B:
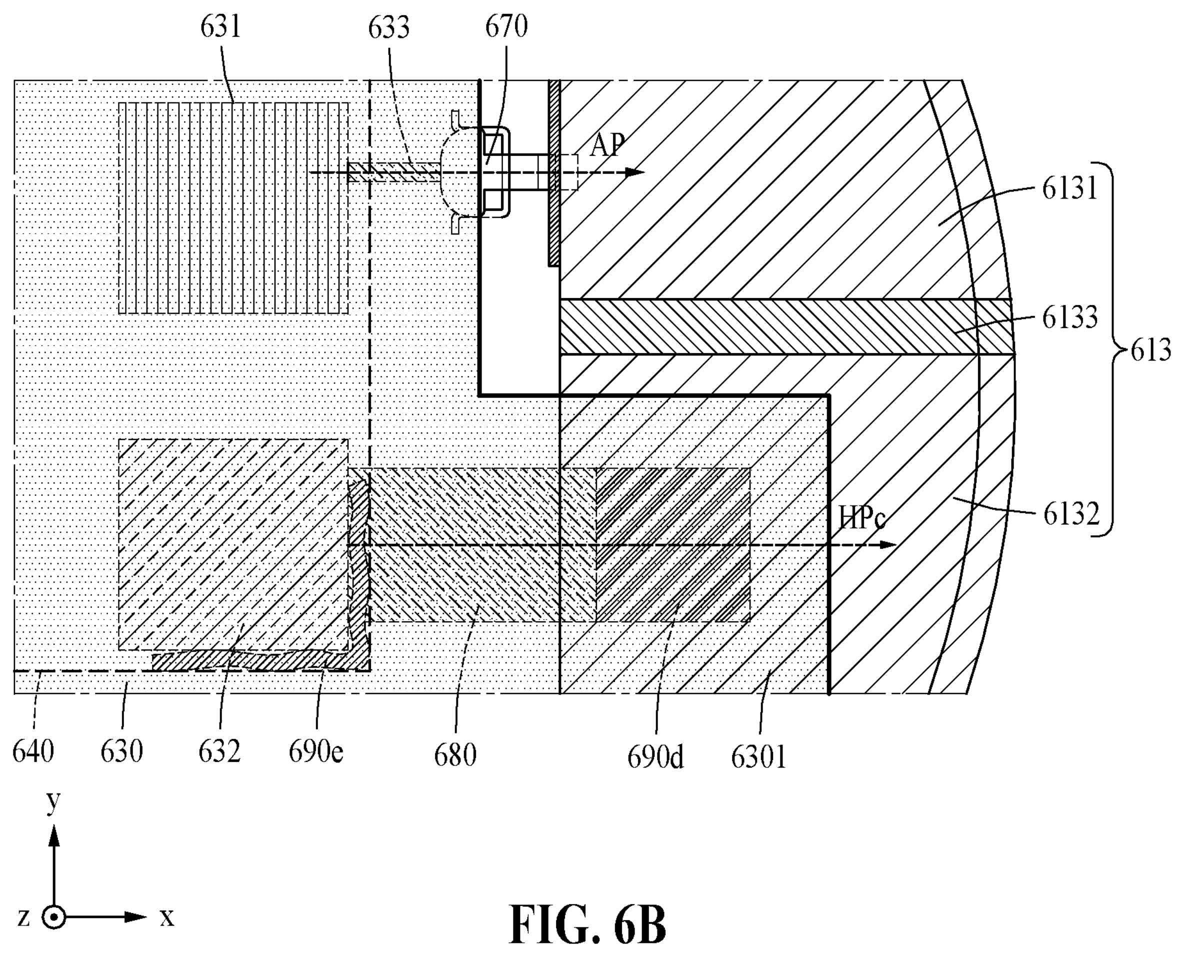
FIG. 6B is a diagram illustrating a transparent view of the inside of part A of FIG. 6A according to various embodiments.

FIG. 6A is a diagram illustrating a top view of an electronic device according to various embodiments. FIG. 6B is a transparent view of the inside of part A of FIG. 6A according to various embodiments.

Referring to FIGS. 6A and 6B, an electronic device 600 (e.g., the electronic device 101 of FIG. 1, the electronic device 200 of FIGS. 2A and 2B, or the electronic device 300 of FIG. 3) according to an example embodiment may have heat dissipation performance improved through a heat dissipation path HPc. In the following description of the electronic device 600 provided with reference to ng FIGS. 6A and 6B, what has been described above may not be repeated to avoid excessive repetition of description.

In an example embodiment, as shown in FIGS. 6A and 6B, a first metal portion 6131 and a second metal portion 6132 may segment a side frame 613 in a circumferential direction. For example, each of the first metal portion 6131 and the second metal portion 6132 may form at least one a part of a circumference of the side frame 613. A circumferential length of the second metal portion 6132 may be longer than a circumferential length of the first metal portion 6131.

In an example embodiment, at least one end 6301 of a PCB 630 may overlap the second metal portion 6132 in a front-back direction (e.g., in a z-axis direction). That is, the at least one end 6301 of the PCB 630 may extend to overlap the second metal portion 6132 in the front-back direction (e.g., the z-axis direction). For example, the at least one end 6301 of the PCB 630 may be disposed before the second metal portion 6132 (e.g., in a +z-axis direction).

In an example embodiment, the first metal portion 6131 may be electrically connected to a FEM 631 to function as an antenna (e.g., the antenna 501 of FIG. 5). For example, the FEM 631 may be electrically connected to the first metal portion 6131 through a connecting member 670 having electrical conductivity. For example, for an electrical connection to the FEM 631, the connecting member 670 may electrically connect a conductive wire 633 disposed on the PCB 630 and the first metal portion 6131. This structure may form an antenna path AP that connects the FEM 631, the conductive wire 633, the connecting member 670, and the first metal portion 6131. However, this is provided only as an example, and other examples that other components are additionally disposed between the components forming the antenna path AP or some of the components forming the antenna path AP are omitted may not be excluded. The connecting member 670 may be implemented as a C-clip, screw, pogo pin, foam, or leaf spring. For example, the connecting member 670 may have elasticity for a stable connection between the PCB 630 and the first metal portion 6131. For example, the connecting member 670 may be disposed to have elasticity substantially in an inward-outward direction (e.g., in an x-axis or y-axis direction).

In an example embodiment, the second metal portion 6132 may be connected to an arbitrary heating element 632 to function as a heat sink. For example, the second metal portion 6132 may be connected to a PAM that consumes a great amount of power and generates a great amount of heat in an RF circuit. Hereinafter, an example structure in which the second metal portion 6132 is connected to the heating element 632 will be described with reference to FIG. 6B. However, this is provided only as an example, and a heating element that is to be connected to the second metal portion 6132 is not limited thereto, and the second metal portion 6132 may be connected to at least one arbitrary heating element.

In an example embodiment, the second metal portion 6132 may be connected to the heating element 632 through a heat transfer structure 680. The heat transfer structure 680 may be formed of a material having high thermal conductivity. The heat transfer structure 680 may be formed of stainless steel (SUS), for example. The heat transfer structure 680 may be disposed the at one end 6301 of the PCB 630 to interconnect the heating element 632 and the second metal portion 6132. For example, as shown in FIG. 6B, when the heating element 632 is surrounded by a shield can 640, the heat transfer structure 680 may be connected to the heating element 632 via the shield can 640. That is, one side of the heat transfer structure 680 may be connected to the shield can 640 and the other side may be connected to the second metal portion 6132. A heat transfer member (not shown) may be disposed between the one side of the heat transfer structure 680 and the shield can 640. The heat transfer member (not shown) disposed between the one side of the heat transfer structure 680 and the shield can 640 may be, for example, a solid member. A heat transfer member 690*d* may be disposed between the other side of the heat transfer structure 680 and the second metal portion 6132. The heat transfer member 690*d* disposed between the other side of the heat transfer structure 680 and the second metal portion 6132 may be, for example, a solid member. A heat transfer member 690*e* may be disposed between the heating element 632 and the shield can 640. The heat transfer member 690*e* may be disposed in a portion where the heating element 632 and the shield can 640 are adjacent to each other. For example, as shown in FIG. 6B, the heat transfer member 690*e* may be disposed on two sides adjacent to the shield can 640 among four sides of the heating element 632. However, this is provided only as an example, and an arrangement position of the heat transfer member 690*e* is not limited thereto. The heat transfer member 690*e* disposed between the heating element 632 and the shield can 640 may be, for example, a liquid resin that allows it to come into sufficient contact between elements on the PCB 630. For example, the heat transfer members 690*d* and 690*e* may be formed of a non-conductive material to prevent and/or reduce the degradation of antenna performance. This structure may improve heat transfer performance between the heating element 632 and the shield can 640.

In an example embodiment, the heat dissipation path HPc may be formed by the heat transfer structure 680. For example, the heat dissipation path HPc may be formed through the heating element 632, the heat transfer member 690*e*, the shield can 640, the heat transfer member (not shown), the heat transfer structure 680, the heat transfer member 690*d*, and the second meta portion 6132. However, this is provided only as an example, and other examples that other components are additionally disposed between the components forming the heat dissipation path HPc or some of the components forming the heat dissipation path HPc are omitted may not be excluded. For example, without a separate heat transfer structure (e.g., the heat transfer structure 680), the PCB 630 (e.g., the at least one end 6301) may function substantially as a heat transfer structure. For example, the PCB 630 may include a metal layer (not shown) extending from the heating element 632 to the at least one end 6301 of the PCB 630. At least a portion of the extended metal layer may overlap the heat transfer member 690*d* (e.g., in the +z-axis direction). Of the at least one end 6301 of the PCB 630, an area disposed near the side frame 613 may include a fill-cut area in which the metal layer is not formed to prevent and/or reduce the degradation of antenna performance. In this case, heat generated from the heating element 632 may be dissipated to the outside through the heat dissipation path HPc. Accordingly, the second metal portion 6132 may function as a heat sink that dissipates the heat generated in the heating element 632 to the outside.

In an example embodiment, through the structure shown in FIGS. 6A and 6B, the first metal portion 6131 and the second metal portion 6132 may be electrically separated from each other by the segmentation member 6133, and the first metal portion 6131 and the second metal portion 6132 may function as an antenna and a heat dissipation member (e.g., a heat sink), respectively. That is, the antenna path AP and the heat dissipation path HPc do not electrically interfere with each other, and thus even when the second metal portion 6132 functions as a heat sink, the antenna performance of the first metal portion 6131 may be maintained. As the heat sink performance may be improved when a portion exposed to the outside increases, forming a circumferential length of the second metal portion 6132 to be greater than a circumferential length of the first metal portion 6131 may improve the heat sink performance of the second metal portion 6132.

In an example embodiment, when the heat transfer member 690*d* disposed between the other side of the heat transfer structure 680 and the second metal portion 6132 is a solid member, the heat transfer member 690*d* may have elasticity in one direction. In this case, the heat transfer member 690*d* may be disposed to have elasticity in a direction different from that of the connecting member 670. For example, when the connecting member 670 is elastic substantially in the inward-outward direction (e.g., in the x-axis or y-axis direction), the heat transfer member 690*d* may be disposed to have elasticity substantially in the front-back direction (e.g., in the z-axis direction). By this structure, the connecting member 670 and the heat transfer member 690*d* may have different elastic directions, and thus the elasticity of the heat transfer member 690*d* may prevent and/or reduce the contact between the connecting member 670 and the first metal portion 6131 from being unintentionally released.

The heat dissipation path HPc shown in FIG. 6B is provided only as an example, and a heat dissipation path having substantially the same or similar structure as or to the heat dissipation path HPc may be formed even for an element that generates heat, in addition to the heating element 632. In addition, it should be noted that the structure of the heat dissipation paths HPa and HPb described above with reference to FIGS. 4A and 4B may also be applied to a segmental structure of the side frame 613 shown in FIGS. 6A and 6B. In addition, for a wireless charging coil (e.g., the wireless charging coil 460 of FIG. 4B), a heat dissipation path of substantially the same or similar structure as or to the heat dissipation path HPc shown in FIG. 6B may be formed through a rear side (e.g., a −z axial direction) portion of the second metal portion 6132.

Figures 7A, 7B:
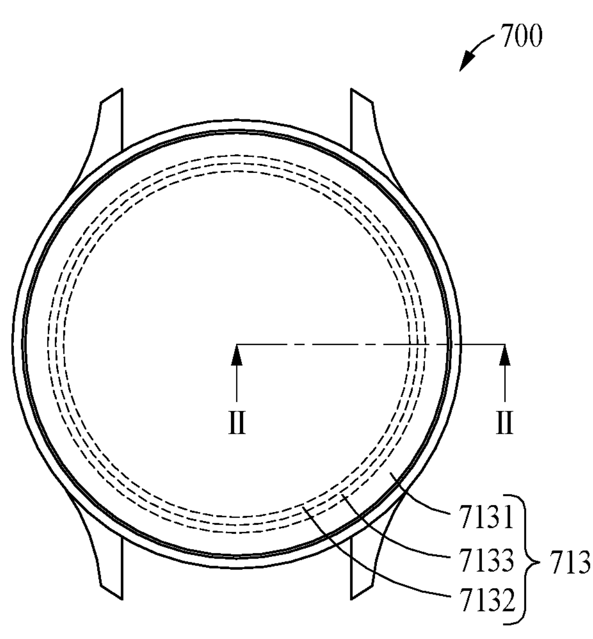
FIG. 7A is a diagram illustrating top view of an electronic device according to an example embodiment.
FIG. 7B is a cross-sectional view taken along a line II-II of FIG. 7A according to various embodiments.

FIG. 7A is a diagram illustrating a top view of an electronic device according to various embodiments. FIG. 7B is a cross-sectional view taken along a line II-II of FIG. 7A according to various embodiments.

Referring to FIGS. 7A and 7B, an electronic device 700 (e.g., the electronic device 101 of FIG. 1, the electronic device 200 of FIGS. 2A and 2B, or the electronic device 300 of FIG. 3) according to an example embodiment may have heat dissipation performance improved through a heat dissipation path HPd. In the following description of the electronic device 700 provided with reference to FIGS. 7A and 7B, what has been described above may not be repeated to avoid excessive repetition of description.

In an example embodiment, as shown in FIGS. 7A and 7B, a first metal portion 7131 and a second metal portion 7132 may segment a side frame 713 in an inward-outward direction (e.g., in an x-axis or y-axis direction) and in a front-back direction (e.g., in a z-axis direction). For example, at least a portion of the side frame 713 may be segmented in the x-axis or y-axis direction, and another portion thereof may be segmented in the z-axis direction. For example, at least a portion of a segmented surface of the side frame 713 may be a plane substantially in a circumferential direction, and at least another portion thereof may be a plane parallel to an x-y plane. The second metal portion 7132 may include an inner portion 7132*a* and an outer portion 7132*b*. The inner portion 7132*a* may be disposed further inside than the first metal portion 7131 (e.g., in an −x-axis direction or −y-axis direction). The outer portion 7132*b* may extend outward (e.g., in a +x-axis or +y-axis direction) from at least a portion (e.g., a lower end) of the inner portion 7132*a* to be exposed to the outside. The outer portion 7132*b* may be disposed behind the first metal portion 7131 (e.g., in a −z-axis direction). By this structure, at least a portion of the second metal portion 7132 may be disposed inside, while at least another portion thereof may be exposed to the outside. For example, the first metal portion 7131 and the second metal portion 7132 may be electrically separated from each other by the segmentation member 7133.

In an example embodiment, the first metal portion 7131 may be electrically connected to a FEM 731 to function as an antenna (e.g., the antenna 501 of FIG. 5). For example, an antenna path AP that connects the FEM 731, a conductive wire (not shown), a connecting member 770, and the first metal portion 7131 may be formed.

In an example embodiment, the second metal portion 7132 may be connected to an arbitrary heating element 732 to function as a heat sink. For example, the heat dissipation path HPd may be formed through the heating element 732, a heat transfer member (not shown), a shield can 740, a heat transfer member 790*a*, a front structure 781, a side structure 782, a heat transfer member 790*b*, and the second metal portion 7132. The heat dissipation path HPd of FIG. 7B may be substantially the same as the first heat dissipation path HPa described above with reference to FIGS. 4A and 4B, and a detailed description thereof may not be repeated here.

The heat dissipation path HPd shown in FIG. 7B is provided only as an example, and a heat dissipation path of substantially the same or similar structure as or to the heat dissipation path HPd may be formed even for an element that generates heat, in addition to the heating element 732. Also, for a segmental structure of the side frame 713 shown in FIGS. 7A and 7B, the structure of the second heat dissipation path HPb described above with reference to FIGS. 4A and 4B and the structure of the heat dissipation path HPc described above with reference to FIGS. 6A and 6B may be applied.

Figure 8A:
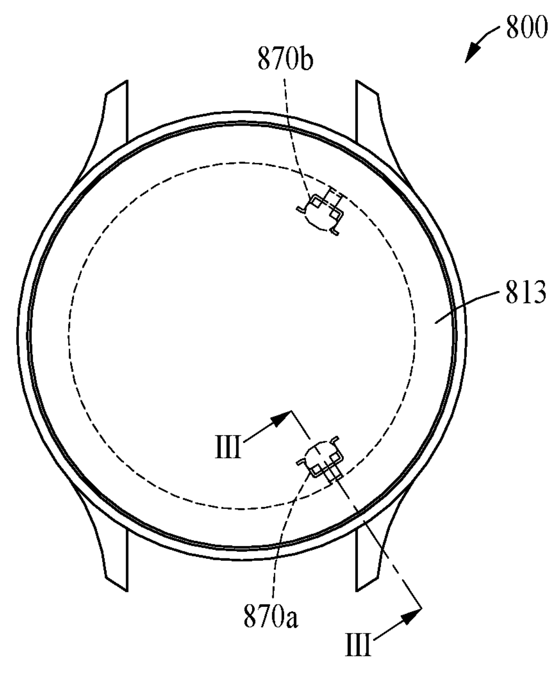
FIG. 8A is diagram illustrating a top view of an electronic device according to various embodiments.
Figure 8B:
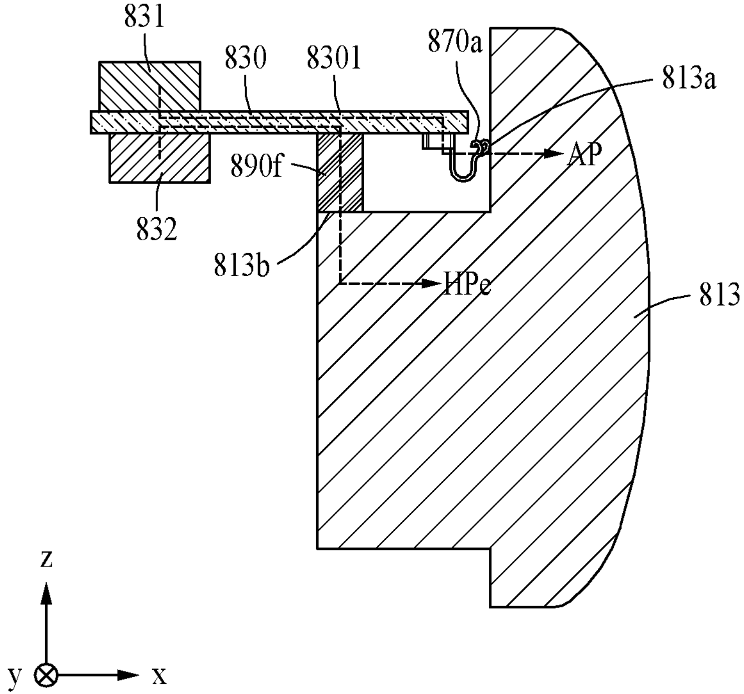
FIG. 8B is a cross-sectional view taken along a line III-III of FIG. 8A according to various embodiments.

FIG. 8A is a diagram illustrating a top view of an electronic device according to various embodiments. FIG. 8B is a cross-sectional view taken along a line III-III of FIG. 8A according to various embodiments.

Referring to FIGS. 8A and 8B, an electronic device 800 (e.g., the electronic device 101 of FIG. 1, the electronic device 200 of FIGS. 2A and 2B, or the electronic device 300 of FIG. 3) according to an example embodiment may have heat dissipation performance improved through a heat dissipation path HPe. In the following description of the electronic device 800 provided with reference to FIGS. 8A and 8B, what has been described above may not be repeated to avoid excessive repetition of description.

In an example embodiment, a side frame 813 may be integrally formed without being segmented. For example, the side frame 813 may include a metal material. The side frame 813 may function as an antenna (e.g., the antenna 501 of FIG. 5) and a heat sink.

In an example embodiment, the side frame 813 may be electrically connected to a FEM 831 in a first portion 813*a* to function as an antenna. For example, the FEM 831 may be electrically connected to the first portion 813*a* of the side frame 813 through a first connecting member 870*a* having electrical conductivity. For example, for an electrical connection to the FEM 831, the first connecting member 870*a* may electrically connect a conductive wire (not shown) disposed on a PCB 830 and the first portion 813*a* of the side frame 813. By this structure, an antenna path AP that connects the FEM 831, the wire (not shown), the first connecting member 870*a*, and the first portion 813*a* of the side frame 813 may be formed. However, this is provided only as an example, and other examples that other components are additionally disposed between the components forming the antenna path AP or some of the components forming the antenna path AP are omitted may not be excluded. The first connecting member 870*a* may be implemented as a C-clip, screw, pogo pin, foam, or leaf spring. For example, the first connecting member 870*a* may have elasticity for a stable connection between the PCB 830 and the first portion 813*a* of the side frame 813. For example, the first connecting member 870*a* may be disposed to have elasticity substantially in an inward-outward direction (e.g., in an x-axis or y-axis direction), and the first portion 813*a* of the side frame 813 may be any part of an inner surface of the side frame 813 in a circumferential direction.

In an example embodiment, the side frame 813 may be connected to an arbitrary heating element 832 in a second portion 813*b* to function as a heat sink. For example, the arbitrary heating element 832 may be a PAM that consumes a great amount of power and generates a great amount of heat in an RF circuit. Hereinafter, an example structure in which the second portion 813*b* of the side frame 813 is connected to the heating element 832 will be described with reference to FIG. 8B. However, this is provided only as an example, and a heating element connected to the second portion 813*b* of the side frame 813 is not limited thereto, and the second portion 813*b* of the side frame 813 may be connected to at least one arbitrary heating element.

In an example embodiment, at least one end 8301 of the PCB 830 may overlap the side frame 813 in a front-back direction (e.g., in a z-axis direction). That is, the at least one end 8301 of the PCB 830 may extend to overlap the side frame 813 in the front-back direction (e.g., in the z-axis direction). For example, the at least one end 8301 of the PCB 830 may be disposed before the side frame 813 (e.g., in a +z-axis direction). The PCB 830 (e.g., the at least one end 8301) may function substantially as a heat transfer structure.

For example, the PCB 830 may include a metal layer (not shown) extending from the heating element 832 to the at least one end 9301 of the PCB 830. At least a portion of the extended metal layer may overlap a heat transfer member 890*f* (e.g., in the +z-axis direction). Of the at least one end 8301 of the PCB 830, an area disposed near the side frame 813 may include a fill-cut area in which the metal layer is not formed to prevent and/or reduce the degradation of antenna performance. The one end 8301 of the PCB 830 may be connected to the second portion 813*b* of the side frame 813. The heat transfer member 890*f* may be disposed between the one end 8301 of the PCB 830 and the second portion 813*b* of the side frame 813. The heat transfer member 890*f* disposed between the one end 8301 of the PCB 830 and the second portion 813*b* of the side frame 813 may be, for example, a solid member. For example, the heat transfer member 890*f* may be formed of a non-conductive material to prevent and/or reduce the degradation of antenna performance. For example, the heat dissipation path HPe may be formed through the heating element 832, the one end 8301 of the PCB 830, the heat transfer member 890*f*, and the side frame 813. However, this is provided only as an example, and other examples that other components are additionally disposed between the components forming the heat dissipation path HPe or some of the components forming the heat dissipation path HPe are omitted may not be excluded. For example, as described above with reference to FIG. 6B, a separate heat transfer structure (e.g., the heat transfer structure 680 of FIG. 6B) may be provided to form a heat dissipation path.

In an example embodiment, when the heating element 832 is a PAM of an RF circuit, the heat dissipation path HPe may be formed near the first connecting member 870*a* and/or the second connecting member 870*b*. For example, the first connecting member 870*a* and the second connecting member 870*b* may be connecting members for forming a shorting part and a feeding part of the RF circuit, respectively. The RF circuit may be disposed near the side frame 813 to minimize and/or reduce antenna signal loss. For example, the RF circuit may be disposed near the first connecting member 870*a* or the second connecting member 870*b*. To maximize and/or increase the heat dissipation effect of the PAM of the RF circuit, the heat dissipation path HPe may be formed near the PAM (e.g., the heating element 832). For example, a portion (e.g., the one end 8301) of the PCB 830 adjacent to a portion in which the PAM is mounted may extend to overlap the side frame 813 in the front-back direction (e.g., in the z-axis direction). The heat transfer member 890*f* may be disposed in the portion (e.g., the one end 8301) adjacent to the portion in which the PAM is mounted.

In an example embodiment, when the heat transfer member 890*f* disposed between the one end 8301 of the PCB 830 and the second portion 813*b* of the side frame 813 is a solid member, the heat transfer member 890*f* may have elasticity in one direction. In this case, the heat transfer member 890*f* may be disposed to have elasticity in a direction different from that of the first connecting member 870*a*. For example, when the first connecting member 870*a* has elasticity substantially in the inward-outward direction (e.g., in the x-axis or y-axis direction), the heat transfer member 890*f* may have elasticity substantially in the front-rear direction (e.g., in the z-axis direction). By this structure, the first connecting member 870*a* and the heat transfer member 890*f* may not have the same elasticity direction, and thus the elasticity of the heat transfer member 890*f* may prevent and/or reduce the contact between the first connecting member 870*a* and the first portion 813*a* of the side frame 813 from being unintentionally released.

In an example embodiment, a shield can (not shown) and/or a heat transfer structure (not shown) may be disposed at the one end 8301 of the PCB 830 to overlap the at least one end 8301 of the PCB 830 and the side frame 813 in the front-back direction (e.g., in the z-axis direction).

The heat dissipation path HPe shown in FIG. 8B is provided only as an example, and a heat dissipation path of substantially the same or similar structure as or to that of the heat dissipation path HPe may be formed for an element that generates heat in addition to the heating element 832. For example, a separate heat dissipation path may be formed through a third portion (not shown) of the side frame 813. In addition, even in an integral structure of the side frame 813 shown in FIGS. 8A and 8B, the structure of the heat dissipation paths HPa and HPb described above with reference to FIGS. 4A and 4B, the structure of the heat dissipation path HPc described above with reference to FIGS. 6A and 6B, or the structure of the heat dissipation path HPd described above with reference to FIGS. 7A and 7B may be applied.

Figure 9:
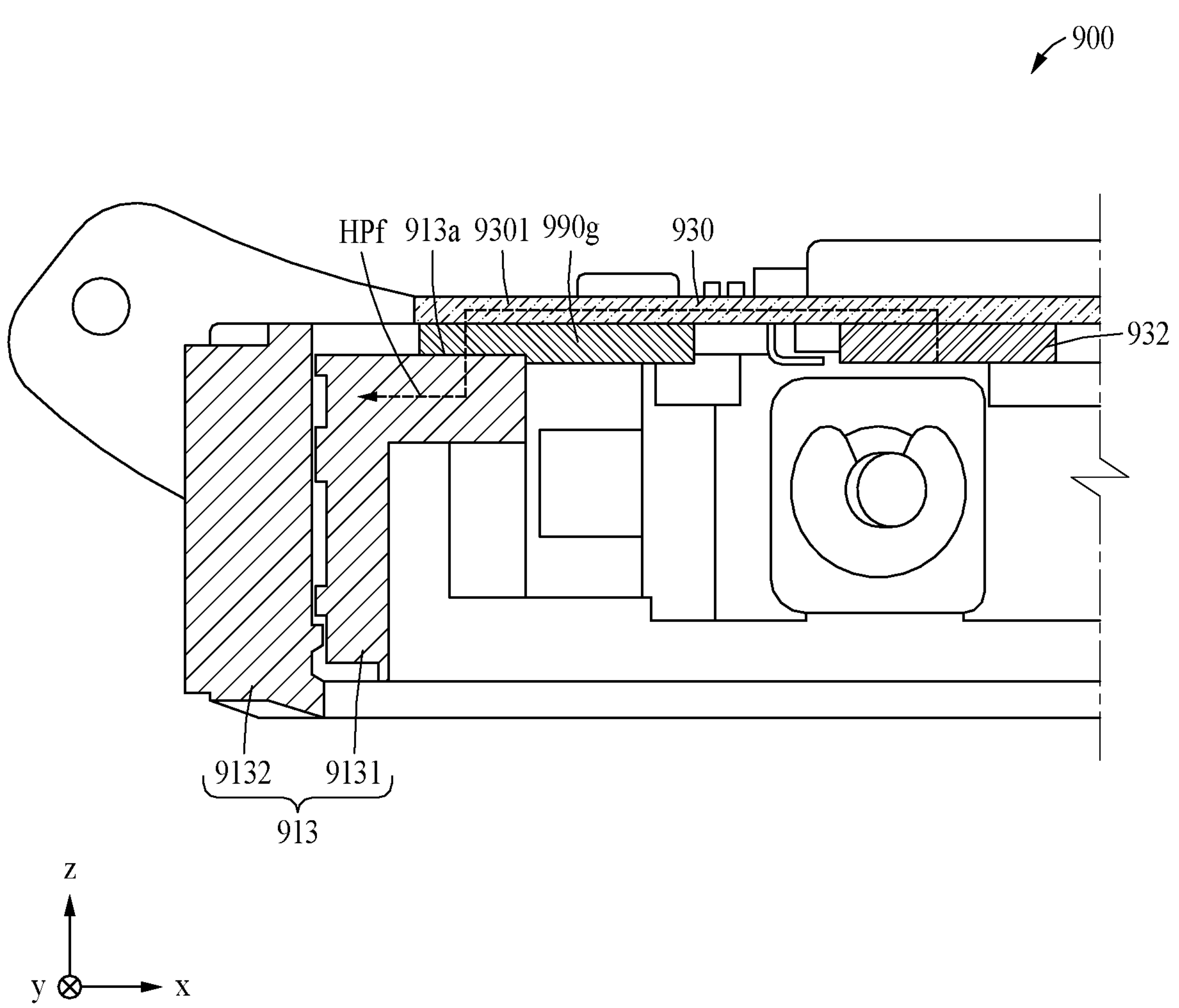
FIG. 9 is a cross-sectional view of an electronic device according to various embodiments.

FIG. 9 is a cross-sectional view of an electronic device according to various embodiments.

Referring to FIG. 9, an electronic device 900 (e.g., the electronic device 101 of FIG. 1, the electronic device 200 of FIGS. 2A and 2B, or the electronic device 300 of FIG. 3) according to an example embodiment may have heat dissipation performance improved through a heat dissipation path HPf. In the following description of the electronic device 900 provided with reference to FIG. 9, what has been described above may not be repeated here to avoid excessive repetition of description.

In an example embodiment, a side frame 913 may be connected to an arbitrary heating element 932 to function as a heat sink. For example, the arbitrary heating element 932 may be a PAM that consumes a great amount of power and generates a great amount of heat in an RF circuit. However, this is provided only as an example, and a heating element connected to the side frame 913 is not limited thereto, and the side frame 913 may be connected to at least one arbitrary heating element.

In an example embodiment, at least one end 9301 of a PCB 930 may overlap the side frame 913 in a front-back direction (e.g., in a z-axis direction). That is, the at least one end 9301 of the PCB 930 may extend to overlap the side frame 913 in the front-back direction (e.g., in the z-axis direction). For example, the at least one end 9301 of the PCB 930 may be disposed before the side frame 913 (e.g., in a +z-axis direction). The PCB 930 (e.g., the at least one end 9301) may function substantially as a heat transfer structure. For example, the PCB 930 may include a metal layer (not shown) extending from the heating element 932 to the at least one end 9301 of the PCB 930. At least a portion of the extended metal layer may overlap a heat transfer member 990*g* (e.g., in the +z-axis direction). Of the at least one end 9301 of the PCB 930, an area disposed near the side frame 913 may include a fill-cut area in which the metal layer is not formed to prevent and/or reduce the degradation of antenna performance. The one end 9301 of the PCB 930 may overlap a first portion 913*a* of the side frame 913. The one end 9301 of the PCB 930 and the first portion 913*a* of the side frame 913 may be connected to each other through the heat transfer member 990*g*. That is, the heat transfer member 990*g* may be disposed between the one end 9301 of the PCB 930 and the first portion 913*a* of the side frame 913. For example, the heat transfer member 990*g* may be a solid member. The heat transfer member 990*g* may be formed to have elasticity and be compressively deformable. For example, the heat transfer member 990*g* may be formed of a non-conductive material to prevent and/or reduce the degradation of antenna performance. At least a portion of the heat transfer member 990*g* may be compressively deformed between the one end 9301 of the PCB 930 and the first portion 913*a* of the side frame 913. For example, the heat transfer member 990*g* may have a thickness of approximately 0.75 mm, and of the heat transfer member 990*g*, a portion disposed between the one end 9301 of the PCB 930 and the first portion 913*a* of the side frame 913 may have a thickness of approximately 0.61 mm. The heat dissipation path HPf may be formed through the heating element 932, the one end 9301 of the PCB 930, the heat transfer member 990*g*, and the side frame 913. As the heat dissipation path HPf is shortened, it may be effective to form the heating element 932 to be close to an outer edge of the electronic device 900. However, this is provided only as an example, and other examples that other components are additionally disposed between the components forming the heat dissipation path HPf or some of the components forming the heat dissipation path HPf are omitted may not be excluded. For example, as described above with reference to FIG. 6B, a separate heat transfer structure (e.g., the heat transfer structure 680 of FIG. 6B) may be provided to form a heat dissipation path.

In an example embodiment, the side frame 913 may be segmented in an inward-outward direction (e.g., in an x-axis or y-axis direction). For example, a segmented surface of the side frame 913 may be substantially a circumferential plane. For example, the side frame 913 may include an inner portion 9131 and an outer portion 9132. However, this is provided only as an example, and the structure of the side frame shown in FIGS. 4A and 4B, 6A and 6B, 7A and 7B, and 8A and 8B may also be applied even for the structure of the heat dissipation path HPf shown in FIG. 9. In addition, although an antenna path is omitted in FIG. 9, the structure of the antenna path described above with reference to FIGS. 4A and 4B, 6A and 6B, 7A and 7B, and 8A and 8B may also be applied even for the structure of the heat dissipation path HPf shown in FIG. 9.

The heat dissipation path HPf shown in FIG. 9 is provided only as an example, and a heat dissipation path of the same or similar structure as or to that of the heat dissipation path HPf may be formed even for an element that generates heat in addition to the heating element 932. In addition, even for the structure of the side frame 913 shown in FIG. 9, the structure of the heat dissipation paths HPa and HPb described above with reference to FIGS. 4A and 4B, the structure of the heat dissipation path HPc described above with reference to FIGS. 6A and 6B, the structure of the heat dissipation path HPd described above with reference to FIGS. 7A and 7B, or the structure of the heat dissipation path HPe described above with reference FIGS. 8A and 8B may also be applied.

Figure 10A:
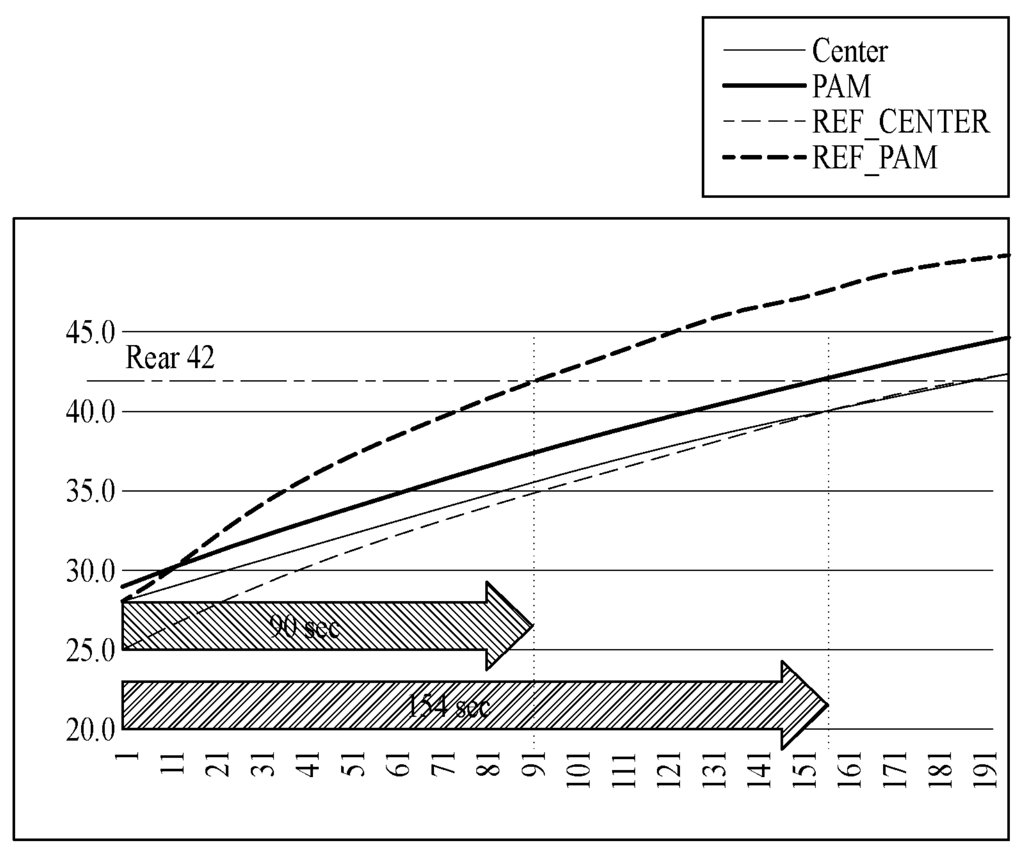
FIG. 10A is a graph illustrating a result of testing heat dissipation performance of an electronic device to which a heat dissipation path is applied according to various embodiments.

FIG. 10A is a graph illustrating a result of testing heat dissipation performance of an electronic device to which a heat dissipation path (e.g., HPa to HPf) is applied according to an example embodiment. In FIG. 10A, a comparative example may correspond to an electronic device without a heat dissipation path, and testing may be performed based on MAX TX POWER (23 dBm).

Referring to FIG. 10A, based on a PAM, in the case of the comparative example, it only takes 90 seconds to reach a temperature of 42 degrees (°). In contrast, it is verified that, in the case of an electronic device according to an example embodiment (e.g., the electronic device 400 of FIG. 4A, the electronic device 600 of FIG. 6A, the electronic device 700 of FIG. 7A, the electronic device 800 of FIG. 8A, or the electronic device 900 of FIG. 9), it takes 154 seconds to reach the temperature of 42°. That is, based on the use of MAX TX POWER (23 dBm), it is verified that the electronic device according to an example embodiment has a communication time that is improved by approximately 71% compared to the comparative example. As a result, it is verified that the electronic device according to an example embodiment has improved heat dissipation performance compared to the comparative example without a heat dissipation path formed.

FIG. 10B is a table showing a result of testing antenna performance of an electronic device to which a heat dissipation path (e.g., HPa to HPf) is applied according to various embodiments. In FIG. 10B, a comparative example may correspond to an electronic device without a heat dissipation path.

Referring to FIG. 10B, it is verified that an electronic device according to an example embodiment (e.g., the electronic device 400 of FIG. 4A, the electronic device 600 of FIG. 6A, the electronic device 700 of FIG. 7A, the electronic device 800 of FIG. 8A, or the electronic device 900 of FIG. 9) has substantially the same level of antenna performance as the comparative example. As a result, it is verified that, in the case of the electronic device according to an example embodiment, antenna performance is not degraded but is maintained at substantially the same level, even though a heat dissipation path (e.g., HPa to HPf) is formed.

Figure 11:
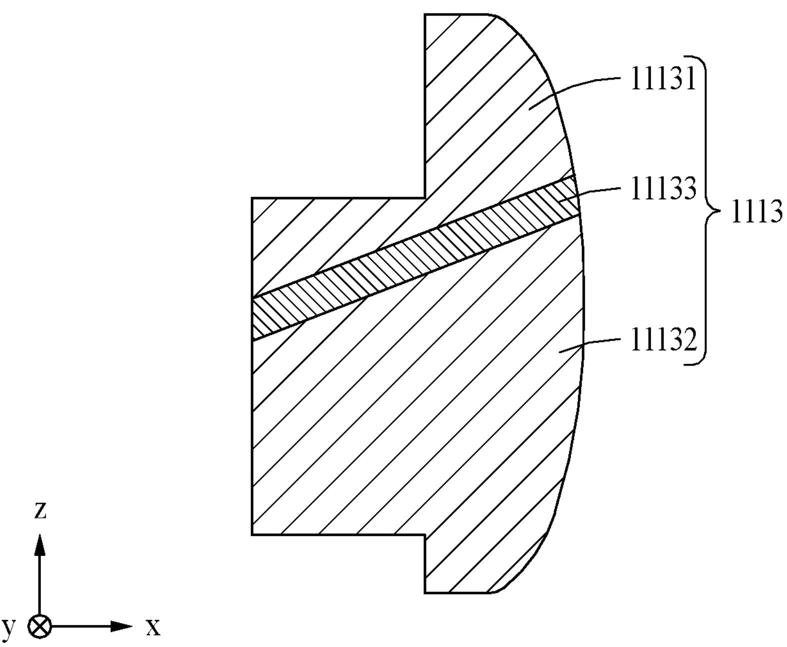
FIG. 11 is a cross-sectional view of a segmental structure of a side frame of an electronic device according to various embodiments.

FIG. 11 is a cross-sectional view of a segmental structure of a side frame of an electronic device according to various embodiments. Referring to FIG. 11, a side frame 1113 of an electronic device (e.g., the electronic device 101 of FIG. 1, the electronic device 200 of FIGS. 2A and 2B, or the electronic device 300 of FIG. 3) according to an example embodiment may be segmented in a front-back direction (e.g., in a z-axis direction), and may be formed with a segmented surface inclined. For example, the side frame 1113 may be segmented with respect to a plane inclined forward (e.g., in a +z-axis direction), facing from the inside (e.g., in a −x-axis or −y-axis direction) toward the outside (e.g., in a +x-axis or +y-axis direction). A first metal portion 11131 may be disposed before a second metal portion 11132 (e.g., in the +z-axis direction). For example, the first metal portion 11131 and the second metal portion 11132 may be electrically separated from each other by the segmentation member 11133. The first metal portion 11131 may function as an antenna (e.g., the antenna 501 of FIG. 5), and the second metal portion 11132 may function as a heat sink. This structure shown in FIG. 11 may increase a portion of the second metal portion 11132 exposed to the outside, and heat dissipation performance may thus be improved.

Figure 12:
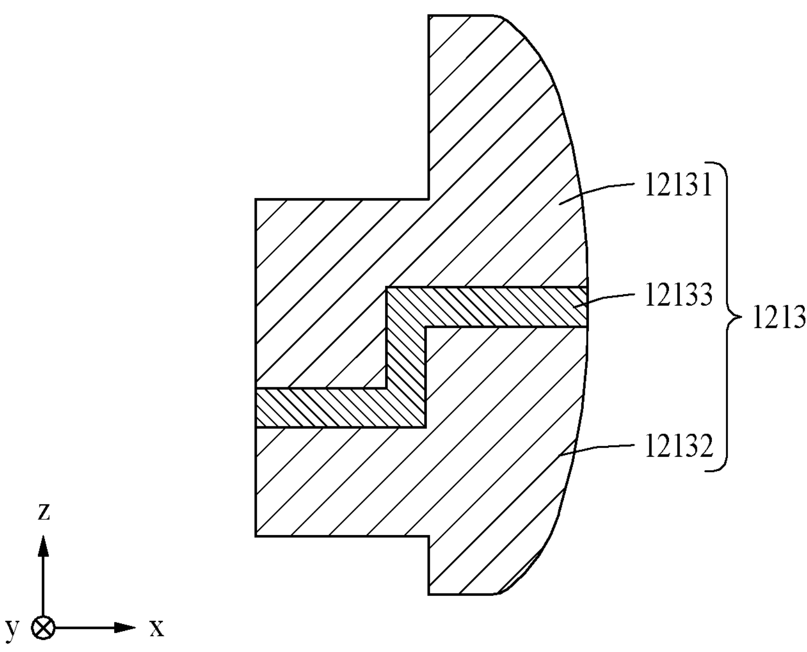
FIG. 12 is a cross-sectional view of a segmental structure of a side frame of an electronic device according to various embodiments.

FIG. 12 is a cross-sectional view of a segmental structure of a side frame of an electronic device according to various embodiments. Referring to FIG. 12, a side frame 1213 of an electronic device (e.g., the electronic device 101 of FIG. 1, the electronic device 200 of FIGS. 2A and 2B, or the electronic device 300 of FIG. 3) according to an example embodiment may be segmented in a front-back direction (e.g., in a z-axis direction), and may be formed with a segmented surface stepped. For example, the side frame 1213 may be segmented based on a plane stepped forward (e.g., in a +z-axis direction), facing from the inside (e.g., in a −x-axis or −y-axis direction) to the outside (e.g., in a +x-axis or +y-axis direction). A first metal portion 12131 may be disposed before a second metal portion 12132 (e.g., in the +z-axis direction). For example, the first metal portion 12131 and the second metal portion 12132 may be electrically separated from each other by the segmentation member 12133. The first metal portion 12131 may function as an antenna (e.g., the antenna 501 of FIG. 5), and the second metal portion 12132 may function as a heat sink. This structure shown in FIG. 12 may increase a portion of the second metal portion 12132 exposed to the outside, and heat dissipation performance may thus be improved.

It should be noted that a segmental structure of a side frame of an electronic device according to an example embodiment is not limited to what is shown in the accompanying drawings. It should be noted that the shape, size, or ratio of the segmental structure, or the number of segments of the side frame shown in the accompanying drawings are all provided only as examples. In addition, it should be noted that the structure of a heat dissipation path described herein may be applied to various segmental structures of the side frame.

According to various example embodiments of the present disclosure, an electronic device may include: a housing including a front plate, a rear plate facing an opposite direction to the front plate, and a side frame surrounding a space between the front plate and the rear plate; and a printed circuit board (PCB) disposed in the space and having a front end module (FEM) and a heating element comprising a thermally conductive material mounted thereon, wherein the side frame may be segmented into at least a first metal portion and a second metal portion, a segmentation member comprising a non-conductive material may be disposed between the first metal portion and the second metal portion, and the first metal portion may be electrically connected to the FEM and the second metal portion may be connected to the heating element using heat transfer members comprising a thermal interface material.

In various example embodiments, the first metal portion and the second metal portion may segment the side frame in a front-back direction.

In various example embodiments, the first metal portion may be disposed before the second metal portion.

In various example embodiments, the second metal portion may have a greater volume than a volume of the first metal portion.

In various example embodiments, the first metal portion and the second metal portion may segment the side frame in a circumferential direction.

In various example embodiments, the second metal portion may have a longer circumferential length than a circumferential length of the first metal portion.

In various example embodiments, the electronic device may further include a heat transfer structure comprising a thermal interface material overlapping the second metal portion in the front-back direction and interconnecting the heating element and the second metal portion.

In various example embodiments, the first metal portion and the second metal portion may segment the side frame in an inward-outward direction and in a front-back direction.

In various example embodiments, the second metal portion may include an inner portion disposed further inside the first metal portion and an outer portion extending outside from at least a portion of the inner portion and exposed to the outside.

In various example embodiments, the electronic device may further include a battery disposed behind the PCB in the space; and a heat transfer structure comprising a thermal interface material including a front structure disposed on a front surface of the battery connected to the heating element and a side structure extending from the front structure along a side surface of the battery connected to the second metal portion.

In various example embodiments, the heat transfer members may be disposed between the heating element and the front structure and between the side structure and the second metal portion.

In various example embodiments, the electronic device may further include a wireless charging coil disposed behind the battery in the space, and the heat transfer structure may further include a rear structure extending from the side structure along a rear surface of the battery connected to the wireless charging coil.

In various example embodiments, the electronic device may further include a shield can surrounding the heating element mounted on the PCB, and the heat transfer member may be disposed between the heating and the shield can.

In various example embodiments, the segmentation member may include an insulating member comprising an insulating material or a non-conductive member comprising a non-conductive material.

In various example embodiments, the heating element may be at least one of a power amplifier module (PAM) comprising a power amplifier, a power supply, an application processor (AP), and a communication processor (CP).

According to various example embodiments of the present disclosure, an electronic device may include: a housing including a front plate, a rear plate facing an opposite direction to the front plate, and a side frame surrounding a space between the front plate and the rear plate; and a printed circuit board (PCB) disposed in the space and having a front end module (FEM) and a heating element comprising a thermally conductive material mounted thereon, wherein the side frame may have a first portion electrically connected to the FEM and a second portion connected to the heating element using a heat transfer member comprising a thermal interface material.

In various example embodiments, the FEM may be electrically connected to the first portion of the side frame through a connecting member comprising a conductive material, and the heating element may be connected to the second portion of the side frame through the heat transfer member. In addition, the connecting member may be disposed to have elasticity in an inward-outward direction, and the heat transfer member may be disposed to have elasticity in a front-rear direction.

In various example embodiments, at least a portion of an area adjacent to the side frame in the PCB may include a fill-cut area in which a metal layer is not formed, or the heat transfer member may be formed of a non-conductive material.

In various example embodiments, the side frame may be integrally formed.

According to various example embodiments of the present disclosure, an electronic device may include: a housing including a front plate, a rear plate facing an opposite direction to the front plate, and a side frame surrounding a space between the front plate and the rear plate; and a printed circuit board (PCB) disposed in the space and having a front end module (FEM) and a heating element comprising a thermally conductive material mounted thereon, wherein the side frame may be segmented into at least a first metal portion and a second metal portion in a front-back direction, a segmentation member comprising a non-conductive material may be disposed between the first metal portion and the second metal portion, the first metal portion may be disposed before the second metal portion and may be electrically connected to the FEM and configured to function as an antenna, and the second metal portion may have a greater volume than a volume of the first metal portion and may be connected to the heating element using heat transfer members and configured to function as a heat sink.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device, comprising:

a housing comprising a front plate, a rear plate facing an opposite direction to the front plate, and a side frame surrounding a space between the front plate and the rear plate;

a printed circuit board (PCB) disposed in the space and comprising a front-end module (FEM) and a heating element comprising a thermally conductive material mounted thereon, wherein the side frame is segmented into at least a first metal portion and a second metal portion, wherein, between the first metal portion and the second metal portion, a segmentation member comprising a non-conductive material is disposed, and wherein the first metal portion is electrically connected to the FEM, and the second metal portion is connected to the heating element through a heat transfer structure and first and second heat transfer members each comprising a thermal interface material;

a battery disposed behind the PCB in the space; and the heat transfer structure comprising a thermal interface material and comprising a front portion disposed on a front surface of the battery and connected to the heating element, and a side portion extending from the front portion along a side surface of the battery and connected to the second metal portion, wherein the first heat transfer member is disposed between the heating element and the front portion, and the second heat transfer member is disposed between the side portion and the second metal portion.

2. The electronic device of claim 1, wherein the first metal portion and the second metal portion segment the side frame in a front-back direction.

3. The electronic device of claim 2, wherein the first metal portion is disposed before the second metal portion.

4. The electronic device of claim 2, wherein a volume of the second metal portion is greater than a volume of the first metal portion.

5. The electronic device of claim 1, wherein the first metal portion and the second metal portion segment the side frame in a circumferential direction.

6. The electronic device of claim 5, wherein a circumferential length of the second metal portion is greater than a circumferential length of the first metal portion.

7. The electronic device of claim 1, wherein the first metal portion and the second metal portion segment the side frame in an inward-outward direction and in a front-back direction.

8. The electronic device of claim 7, wherein the second metal portion comprises an inner portion disposed further inward than the first metal portion and an outer portion extending outward from at least a part of the inner portion and exposed to the outside.

9. The electronic device of claim 1, further comprising:

a wireless charging coil disposed behind the battery in the space, wherein the heat transfer structure further comprises a rear portion extending from the side portion along a rear surface of the battery and connected to the wireless charging coil.

10. The electronic device of claim 1, further comprising:

a shield can surrounding the heating element mounted on the PCB, wherein the heat transfer member is disposed between the heating element and the shield can.

11. The electronic device of claim 1, wherein the segmentation member comprises an insulating material or a non-conductive material.

12. The electronic device of claim 1, wherein the heating element is at least one of a power amplifier module (PAM) comprising a power amplifier, a power unit comprising power circuitry, an application processor (AP), or a communication processor (CP).

13. An electronic device, comprising:

a housing comprising a front plate, a rear plate facing an opposite direction to the front plate, and a side frame surrounding a space between the front plate and the rear plate;

a printed circuit board (PCB) disposed in the space and comprising a front-end module FEM) and a heating element comprising a thermally conductive material mounted thereon, wherein the side frame is electrically connected to the FEM in a first portion and connected to the heating element through a heat transfer structure and first and second heat transfer members each comprising a thermal interface material in a second portion;

a battery disposed behind the PCB; and the heat transfer structure comprising a front portion disposed on a front surface of the battery and connected to the heating element, and a side portion extending from the front portion along a side surface of the battery and connected to the second portion of the side frame, wherein the first heat transfer member is disposed between the heating element and the front portion, and the second heat transfer member is disposed between the side portion and the second portion of the side frame.

14. The electronic device of claim 13, wherein the FEM is electrically connected to the first portion of the side frame through a connecting member comprising a conductive material, the heating element is connected to the second portion of the side frame through the heat transfer structure and the first and second heat transfer members, and the connecting member is disposed to have elasticity in an inward-outward direction, and at least one of the first and second heat transfer members are disposed to have elasticity in a front-back direction.

15. The electronic device of claim 13, wherein at least a portion of an area near the side frame of the PCB comprises a fill-cut area in which a metal layer is not formed, or at least one of the first and second heat transfer members comprises a non-conductive material.

16. The electronic device of claim 13, wherein the side frame is integrally formed.

17. An electronic device, comprising:

a housing comprising a front plate, a rear plate facing an opposite direction to the front plate, and a side frame surrounding a space between the front plate and the rear plate;

a printed circuit board (PCB) disposed in the space and comprising a front-end module (FEM) and a heating element comprising a thermally conductive material mounted thereon, wherein the side frame is segmented into at least a first metal portion and a second metal portion in a front-back direction, wherein, between the first metal portion and the second metal portion, a segmentation member comprising a non-conductive material is disposed, wherein the first metal portion is disposed before the second metal portion and is electrically connected to the FEM and configured to function as an antenna, and the second metal portion has a greater volume than a volume of the first metal portion and is connected to the heating element through a heat transfer structure and first and second heat transfer members each comprising a thermal interface material, the second metal portion being configured to function as a heat sink;

a battery disposed behind the PCB; and the heat transfer structure comprising a front portion disposed on a front surface of the battery and connected to the heating element, and a side portion extending from the front portion along a side surface of the battery and connected to the second metal portion, wherein the first heat transfer member is disposed between the heating element and the front portion, and the second heat transfer member is disposed between the side portion and the second metal portion.

* * * * *